United States Patent
Lee

(10) Patent No.: US 9,758,872 B2
(45) Date of Patent: Sep. 12, 2017

(54) DISPLAY APPARATUS AND METHOD OF MANUFACTURING THE SAME

(71) Applicant: SAMSUNG DISPLAY CO., LTD., Yongin, Gyeonggi-Do (KR)

(72) Inventor: Sun-Youl Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/606,950

(22) Filed: Jan. 27, 2015

(65) Prior Publication Data

US 2016/0013253 A1    Jan. 14, 2016

(30) Foreign Application Priority Data

Jul. 10, 2014  (KR) .................. 10-2014-0086881

(51) Int. Cl.
*H01L 27/32* (2006.01)
*C23C 16/50* (2006.01)

(52) U.S. Cl.
CPC .......... *C23C 16/50* (2013.01); *H01L 27/3244* (2013.01); *H01L 2251/566* (2013.01)

(58) Field of Classification Search
None
See application file for complete search history.

(56) References Cited

U.S. PATENT DOCUMENTS

| | | | |
|---|---|---|---|
| 7,968,882 B2 | 6/2011 | Lee et al. | |
| 8,518,727 B2 | 8/2013 | Ryu et al. | |
| 2006/0132461 A1 | 6/2006 | Furukawa et al. | |
| 2009/0273589 A1 | 11/2009 | Asano et al. | |
| 2014/0097430 A1 | 4/2014 | Park et al. | |
| 2014/0131683 A1 | 5/2014 | Kim et al. | |

FOREIGN PATENT DOCUMENTS

| | | |
|---|---|---|
| JP | 4589830 B2 | 9/2010 |
| KR | 10-1084264 B1 | 11/2011 |
| KR | 10-1166069 B1 | 7/2012 |
| KR | 10-1234382 B1 | 2/2013 |
| KR | 10-1243796 B1 | 3/2013 |
| KR | 10-2013-0097310 A | 9/2013 |
| KR | 10-2014-0045836 | 4/2014 |

OTHER PUBLICATIONS

KIPO Office action dated Oct. 1, 2015, for Korean priority Patent application 10-2014-0086881, (8 pages).
Korean Patent Abstract for KR 10-2008-0000849 A, which corresponds to KR Publ. No. 10-1243796 B1, published Jan. 3, 2008, 1 page.
EPO Search Report dated Sep. 18, 2015, for corresponding European Patent application 15168889.2, (9 pages).
KIPO Notice of Allowance dated Sep. 5, 2016, for corresponding Korean Patent Application No. 10-2014-0086881, (6 pages).

*Primary Examiner* — Fernando L Toledo
*Assistant Examiner* — Valerie N Newton
(74) *Attorney, Agent, or Firm* — Lewis Roca Rothgerber Christie LLP

(57) ABSTRACT

A display apparatus includes a substrate on which a central area and a peripheral area adjacent to the central area are arranged. The central area includes a display area. The display apparatus further includes: at least one insulation pattern that is formed in the peripheral area; a groove from which a material for forming the insulation pattern is removed and that is formed adjacent to the insulation pattern; and at least one insulating layer that is interposed between the insulation pattern and the substrate. The groove is located in the at least one insulating layer.

60 Claims, 19 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2014-0086881, filed on Jul. 10, 2014, in the Korean Intellectual Property Office, the disclosure of which is incorporated herein in its entirety by reference.

BACKGROUND

1. Field

One or more embodiments of the present invention relate to a display apparatus and a method of manufacturing the same.

2. Description of the Related Art

Recently, display apparatuses are variously used. Also, as the display apparatuses have evolved to have a small thickness and a light weight, a usage range of the display apparatuses has become wider.

In particular, recently, display apparatuses have been replaced with portable thin flat panel display apparatuses.

The thin display apparatus has a plurality of various films. However, when an external force is applied to the thin display apparatus, or due to a process condition during the manufacture of the thin display apparatus, the various films may be damaged or may serve as a path of crack propagation.

In particular, when display apparatuses are formed from one mother substrate, the manufacturing process may include a process of cutting the mother substrate so as to separate the display apparatuses from each other.

During the cutting process, a crack may occur in the films of the display apparatus, and the films may serve as a path of crack propagation.

Accordingly, durability of the display apparatus may be affected.

SUMMARY

One or more embodiments of the present invention include a display apparatus and a method of manufacturing the same.

Additional aspects will be set forth in part in the description which follows and, in part, will be apparent from the description to those with ordinary skill in the art, or may be learned by practice of the presented embodiments.

According to one or more embodiments of the present invention, a display apparatus includes a substrate having a central area and a peripheral area adjacent to the central area, wherein the central area includes a display area. The display apparatus further includes an insulation pattern at the peripheral area; a groove adjacent to the insulation pattern; and at least one insulating layer interposed between the insulation pattern and the substrate, wherein the groove is located at the at least one insulating layer. A material for forming the insulation pattern may have been removed from the groove, such that the groove is formed adjacent to the insulation pattern.

The groove may be adjacent to at least one edge of the substrate.

The groove may be adjacent to all edges of the substrate.

The insulation pattern may be spaced from at least one edge of the substrate. Here the insulation pattern may be separate from the at least one edge of the substrate.

The at least one insulating layer may be formed as a single layer.

The at least one insulating layer may be formed of a plurality of stacked layers.

The at least one insulating layer may include an inorganic material.

The at least one insulating layer may include oxide, nitride, or oxynitride.

The at least one insulating layer may extend over at least a portion of the central area on the substrate.

The at least one insulating layer may extend over at least a portion of the display area on the substrate.

The at least one insulating layer may completely cover a top surface of the substrate.

The at least one insulating layer may expose a portion of a top surface of the substrate.

The insulation pattern may extend lengthwise in parallel to at least one edge of the substrate.

A plurality of the insulation patterns that are spaced from each other may be formed in one direction, and the groove may be located between the insulation patterns that are adjacent to each other.

A plurality of the insulation patterns may be formed in another direction that crosses the one direction.

At least one edge of the substrate may be defined by a cutting line.

The insulation pattern may be formed as multiple layers.

The insulation pattern may be formed of an inorganic material.

The insulation pattern may include a central insulation pattern and a peripheral insulation pattern around the central insulation pattern, wherein a width of the central insulation pattern may be different from a width of the peripheral insulation pattern.

The width of the central insulation pattern may be greater than the width of the peripheral insulation pattern.

The insulation pattern may be formed as an island pattern.

The insulation pattern may have a curved edge.

The insulation pattern may have a circular-arc edge, a round edge, or an oval edge.

The display apparatus may further include a central insulating layer formed in the central area on the substrate.

The insulation pattern and the central insulating layer may be formed of the same or substantially the same material.

A portion of the central insulating layer may extend over a portion of the peripheral area.

The groove may be located between the central insulating layer and the insulation pattern.

The substrate may include an organic material.

The substrate may be formed as multiple layers.

The substrate may include a first layer including an organic material, a second layer including an organic material, and an insertion layer located between the first layer and the second layer.

The display apparatus may further include at least one conductive pattern that is located in the groove and may contact a top surface or a side surface of the insulation pattern.

The at least one conductive pattern may include a pad unit.

The display apparatus may further include a cover layer that is formed on the insulation pattern.

The cover layer may include an organic material.

The insulation pattern may include a first direction insulation pattern extending along a first direction, and a second direction insulation pattern extending along a second direction that crosses the first direction.

The first direction insulation pattern may be connected to the second direction insulation pattern.

The first direction insulation pattern and the second direction insulation pattern may surround the display area.

The first direction insulation pattern and the second direction insulation pattern may be connected to each other in a one-to-one manner and may surround the display area.

The first direction insulation pattern and the second direction insulation pattern may be connected to each other at their ends.

A plurality of the first direction insulation patterns and a plurality of the second direction insulation patterns may be formed, and two or more first direction insulation patterns from among the plurality of the first direction insulation patterns may be connected to one second direction insulation pattern from among the plurality of the second direction insulation patterns.

The one second direction insulation pattern that is connected to the two or more first direction insulation patterns from among the plurality of the first direction insulation patterns may be located nearest to an edge of the substrate from among the second direction insulation patterns.

The one second direction insulation pattern that is connected to the two or more first direction insulation patterns may be located closer to the display area, compared to another second direction insulation pattern that is located nearest to an edge of the substrate from among the second direction insulation patterns.

One or more first direction insulation patterns from among the plurality of the first direction insulation patterns may not be connected to the plurality of the second direction insulation patterns.

A plurality of the first direction insulation patterns and a plurality of the second direction insulation patterns may be formed, and two or more second direction insulation patterns from among the plurality of the second direction insulation patterns may be connected to one first direction insulation pattern from among the plurality of the first direction insulation patterns.

The one first direction insulation pattern that is connected to the two or more second direction insulation patterns may be located nearest to an edge of the substrate.

The one first direction insulation pattern that is connected to the two or more second direction insulation patterns may be located closer to the display area, compared to another first direction insulation pattern that is located nearest to an edge of the substrate from among the first direction insulation patterns.

One or more second direction insulation patterns from among the plurality of the second direction insulation patterns may not be connected to the plurality of the first direction insulation patterns.

The insulation pattern may further include a connection insulation pattern that connects the first direction insulation pattern and the second direction insulation pattern.

The connection insulation pattern may not be parallel to the first direction and the second direction.

The display apparatus may further include at last one thin-film transistor (TFT) that is formed at the central area of the substrate. The TFT may include an active layer, a gate electrode, a source electrode, and a drain electrode. At least one adjacent insulating layer may be formed adjacent to at least one of the active layer, the gate electrode, the source electrode, and the drain electrode, and the insulation pattern and the at least one adjacent insulating layer may be formed of the same or substantially the same material.

The at least one insulating layer may be formed between the substrate and the at least one TFT.

The at least one adjacent insulating layer may be at least one of a gate insulating layer for insulating the gate electrode from the active layer, and an interlayer insulating layer for insulating the source and drain electrodes from the gate electrode.

The display apparatus may further include a passivation layer for covering the at least one TFT, and the passivation layer may be formed on the insulation pattern.

The display apparatus may further include a first electrode that is electrically connected to the at least one TFT and a pixel defining layer that covers a portion of the first electrode and defines a pixel area, wherein the pixel defining layer is formed on the insulation pattern.

The display apparatus may further include a second electrode that faces the first electrode, and an intermediate layer that is located between the first electrode and the second electrode. The intermediate layer may include an organic emission layer.

According to one or more embodiments of the present invention, a method of manufacturing a display apparatus including a substrate on which a central area and a peripheral area located adjacent to the central area are arranged, is provided. The central area includes a display area. The method includes: forming at least one insulation pattern in the peripheral area; forming a groove adjacent to the at least one insulation pattern; and forming at least one insulating layer between the at least one insulation pattern and the substrate, wherein the groove is located at the at least one insulating layer. The groove may be formed by removing a material for forming the at least one insulation pattern.

The method may further include forming a central insulating layer at the central area of the substrate, and the at least one insulation pattern and the central insulating layer may be formed of the same or substantially the same material.

The at least one insulation pattern and the central insulating layer may be concurrently formed.

The at least one insulating layer may be formed at the peripheral area and the central area.

According to one or more embodiments of the present invention, a method of manufacturing a display apparatus by using a mother substrate is provided. The method includes: cutting the mother substrate along a cutting line, wherein the display apparatus includes a central area and a peripheral area located adjacent to the central area, the central area including a display area; an insulation pattern formed at the peripheral area; a groove adjacent to the insulation pattern; and at least one insulating layer formed between the insulation pattern and the substrate, wherein the groove is located at the at least one insulating layer, and wherein the cutting line corresponds to the groove and is separated from the insulation pattern. The groove may be formed by removing a material for forming the insulation pattern, such that the groove is adjacent to the insulation pattern.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
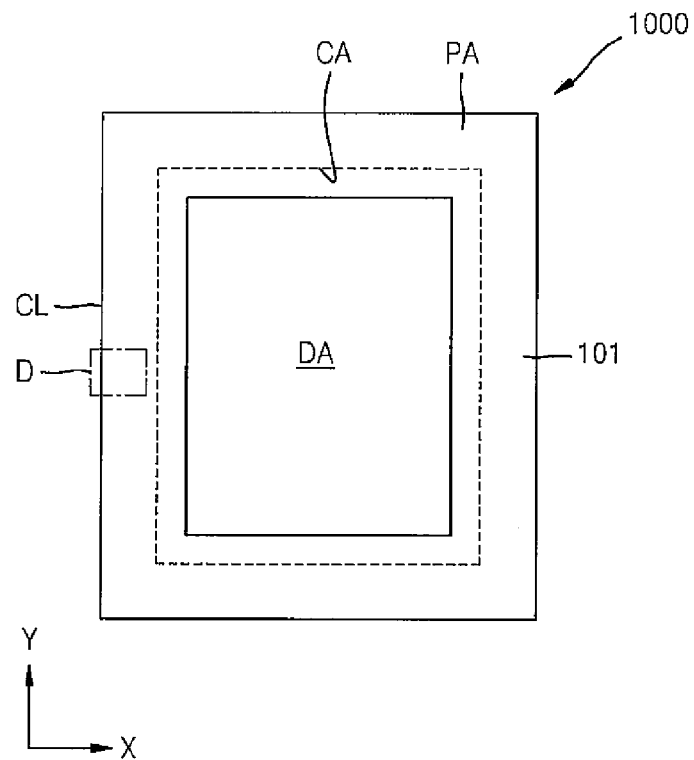
FIG. 1 illustrates a plan view of a display apparatus according to an embodiment of the present invention.

As the present invention allows for various changes and numerous embodiments, example embodiments will be illustrated in the drawings and described in detail in the written description. Effects and features of the present invention and methods of accomplishing the same may be understood more readily by reference to the following detailed description of example embodiments and the accompanying drawings. The present invention may, however, be embodied in many different forms and should not be construed as being limited to the embodiments set forth herein.

Hereinafter, in one or more embodiments, while such terms as "first," "second," etc., may be used, but such components must not be limited to the above terms, and the above terms are used only to distinguish one component from another.

Hereinafter, in one or more embodiments, a singular form may include plural forms, unless there is a particular description contrary thereto.

Hereinafter, in one or more embodiments, terms such as "comprise," "comprising," "include," or "including" are used to specify existence of a recited feature or component, not excluding the existence of one or more other recited features or one or more other components.

Hereinafter, in one or more embodiments, it will also be understood that when an element such as layer, region, or component is referred to as being "on" another element, it can be directly on the other element, or intervening elements such as layer, region, or component may also be interposed therebetween. Further, when a first element is described as "coupled to" or "connected to" a second element, the first element may be directly coupled to or directly connected to the second element without any intervening elements therebetween or may be indirectly (e.g., electrically) coupled to or indirectly connected to the second element with one or more intervening elements interposed therebetween.

In the drawings, for convenience of description, the sizes of layers and regions are exaggerated for clarity. For example, a size and thickness of each element may be random for convenience of description, thus, one or more embodiments of the present invention are not limited thereto.

Hereinafter, in one or more embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

In one or more embodiments, an order of processes may be different from that is described. For example, two processes that are sequentially described may be substantially simultaneously performed, or may be performed in an opposite order to the described order.

Hereinafter, one or more embodiments of the present invention will be described below in more detail with reference to the accompanying drawings. Those components that are the same or are in correspondence are rendered the same reference numeral regardless of the figure number, and redundant explanations are omitted.

As used herein, the term "and/or" includes any and all combinations of one or more of the associated listed items. Expressions such as "at least one of," when preceding a list of elements, modify the entire list of elements and do not modify the individual elements of the list.

Figure 2:
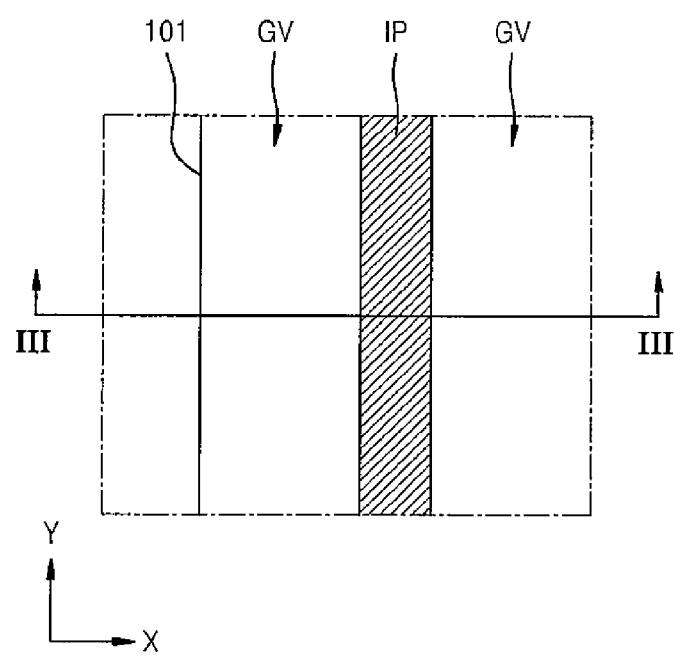
FIG. 2 illustrates a magnified view of a portion D of FIG. 1.

FIG. 1 illustrates a plan view of a display apparatus 1000 according to an embodiment of the present invention. FIG. 2 illustrates a magnified view of a portion D of FIG. 1, and FIG. 3 illustrates a cross-sectional view of the portion D, taken along the line III-III of FIG. 2.

Figure 3:
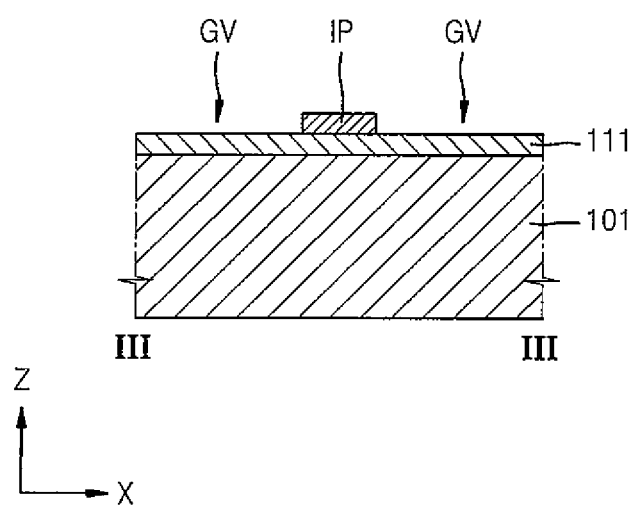
FIG. 3 illustrates a cross-sectional view of the portion D, taken along the line III-III of FIG. 2.

Referring to FIGS. 1 through 3, the display apparatus 1000 includes a substrate 101. The substrate 101 may include one or more of various suitable materials known to those skilled in the art. For example, the substrate 101 may be formed of a glass material, a metal material, or any suitable organic material.

In an embodiment, the substrate 101 may be a flexible substrate 101. Here, the flexible substrate 101 refers to a substrate having flexibility that is well bent, curved, folded, and/or rolled. The flexible substrate 101 may be formed of ultra-thin glass, metal, or plastic. For example, when plastic is used, the substrate 101 may be formed of polyimide (PI) but one or more embodiments are not limited thereto and thus one or more of various suitable materials known to those skilled in the art may be used.

A plurality of the display apparatuses 1000 may be formed on a mother substrate, and may be separated into each display apparatus 1000 in a manner that the mother substrate is cut along cutting lines CL of the substrates 101. FIG. 1 illustrates one display apparatus 1000 that is cut along the cutting line CL and thus is separated. Thus, an edge of the substrate 101 is defined by the cutting line CL.

All edges of the substrate 101, i.e., four edges of the substrate 101 shown in FIG. 1, may be cutting lines CL. In other embodiments, one, two, or three of the four edges of the substrate 101 may be cutting lines CL.

That is, according to a size and/or shape of the mother substrate and/or a number, shapes and sizes of the substrates to be produced therefrom, a position or the number of edges from among all edges of the display apparatus 1000 that are determined as a cutting line CL may vary.

The substrate 101 is partitioned into a peripheral area PA and a central area CA. In more detail, the peripheral area PA refers to an area around the cutting line CL, and the central area CA refers to an area that is inwardly positioned, compared to the peripheral area PA.

However, the present embodiment is not limited thereto. That is, the cutting line CL may not exist. In more detail, one display apparatus 1000 may be formed on a mother substrate, and in this case, the substrate 101 may correspond to the mother substrate, so that the cutting line CL may not exist. In this case, the peripheral area PA may refer to an area adjacent to an edge of the substrate 101, and the central area CA may refer to an area that is inwardly positioned, compared to the peripheral area PA. For convenience of description, it is assumed that the cutting line CL exists in embodiments to be described below.

The central area CA may include at least one display area DA.

The display area DA may include at least one display device (not specified in FIG. 1), e.g., an organic light-emitting device (OLED) for displaying an image. Also, a plurality of pixels may be disposed in the display area DA.

A non-display area (not specified in FIG. 1) may be formed around the display area DA. In more detail, the non-display area may be formed to surround the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not specified in FIG. 1.) may be formed in the non-display area. In this regard, a driver or a plurality of pad units (not specified in FIG. 1) may be disposed in the pad area.

In an embodiment, at least one central insulating layer (not specified in FIG. 1) may be formed in the central area CA so as to prevent or substantially prevent moisture or impurities from penetrating into the display apparatus 1000 via the substrate 101. For example, the central insulating layer may include an inorganic material.

The peripheral area PA refers to the area around the cutting line CL and is arranged in edges of the substrate 101 along the cutting line CL.

An insulation pattern IP is formed in the peripheral area PA. A groove GV from which a material for forming the insulation pattern IP is removed is formed adjacent to the insulation pattern IP.

The first insulating layer 111 is disposed between the substrate 101 and the insulation pattern IP and the groove GV. That is, in the peripheral area PA, the first insulating layer 111 is formed on the substrate 101, and the insulation pattern IP and the groove GV are formed on the first insulating layer 111.

The first insulating layer 111 may be formed of one or more of various suitable insulating materials known to those skilled in the art. In an embodiment, the first insulating layer 111 may be formed of an inorganic material. For example, the first insulating layer 111 may include oxide, nitride, or oxynitride. In more detail, the first insulating layer 111 may include silicon nitride ($SiN_x$), silicon oxide ($SiO_2$), or silicon oxynitride ($SiO_xN_y$).

In an embodiment, the first insulating layer 111 may be formed to be extending to the central area CA or the display area DA. In another embodiment, the first insulating layer 111 may be commonly formed on the central area CA and the peripheral area PA of the substrate 101. That is, the first insulating layer 111 may be formed on an entire top surface of the substrate 101.

In an embodiment, due to the first insulating layer 111, the top surface of the substrate 101 is not exposed in the peripheral area PA. That is, the first insulating layer 111 may be formed to be extending to the cutting line CL of the substrate 101.

However, one or more embodiments of the present invention are not limited thereto, and the first insulating layer 111 may not cover the top surface of the substrate 101 in a portion of the peripheral area PA.

The insulation pattern IP may be formed of one or more of various suitable materials known to those skilled in the art. For example, the insulation pattern IP may be formed of an inorganic or organic material. In an embodiment, the insulation pattern IP may be formed from the same or substantially the same material as at least one of insulating materials that may be formed in the central area CA of the substrate 101. That is, as described in the above embodiment, the at least one central insulating layer may be formed in the central area CA so as to prevent or substantially prevent moisture or impurities from penetrating into the display apparatus 1000 via the substrate 101, and here, the insulation pattern IP may be formed from the same or substantially the same material as the central insulating layer, and in another embodiment, the central insulating layer and the insulation pattern IP may be concurrently (e.g., simultaneously) formed.

The groove GV is located between the insulation pattern IP and the cutting line CL of the substrate 101. The groove GV is located adjacent to the cutting line CL of the substrate 101, and the insulation pattern IP is distant from the cutting line CL of the substrate 101.

The insulation pattern IP may extend lengthwise. That is, as illustrated in FIG. 2, the insulation pattern IP may have a shape that extends lengthwise in parallel to the cutting line CL of the substrate 101. Here, a length of the insulation pattern IP may vary, and thus may be greater or lesser than a length of the display area DA.

In an embodiment, although not illustrated, a plurality of the insulation patterns IP may be disposed in (e.g., arranged along) a longitudinal direction (a Y-axis direction of FIGS. 1 and 2).

Two grooves GV are formed so that the insulation pattern IP is located between the two grooves GV. That is, the grooves GV are formed by partially removing a material that forms the insulation pattern IP.

The groove GV includes a groove GV that is adjacent to the cutting line CL of the substrate 101. Also, in an embodiment, the groove GV may be adjacent to all cutting lines CL of the substrate 101. That is, the groove GV may include a groove GV that is adjacent to all edges of the substrate 101.

However, the present embodiment is not limited thereto, and the groove GV may include a groove GV that is adjacent to only at least one edge of the substrate 101

The groove GV that is adjacent to the cutting line CL of the substrate 101, the groove arranged in the peripheral area PA of the display apparatus, blocks or reduces crack propagation from the edge of the substrate 101. For example, the groove GV that is adjacent to the cutting line CL of the substrate 101 firstly prevents or reduces propagation of a crack that may occur on the substrate 101 when each display apparatus 1000 is cut and then is separated from the mother substrate.

In particular, the groove GV corresponds to a top surface of the first insulating layer 111 on the substrate 101. Since the first insulating layer 111 is formed in the groove GV that is adjacent to the insulation pattern IP, the substrate 101 may be efficiently protected, and also, the occurrence and propagation of the crack may be prevented or reduced.

Also, due to the first insulating layer 111, it is possible to prevent or substantially prevent the insulation pattern IP from being delaminated from the substrate 101.

The insulation pattern IP is adjacent to the groove GV that is adjacent to the cutting line CL of the substrate 101 and thus secondly prevents or substantially prevents the propagation of the crack. Also, the insulation pattern IP improves or may improve durability of the peripheral area PA. For example, when the substrate 101 is formed of a flexible material and thus the display apparatus 1000 has flexibility, the insulation pattern IP may efficiently protect the peripheral area PA while a curving or bending motion occurs at the peripheral area PA.

The groove GV that is adjacent to a side of the insulation pattern IP that is distant from the cutting line CL may block or substantially prevent a crack that additionally occurs or propagates.

Figure 4:
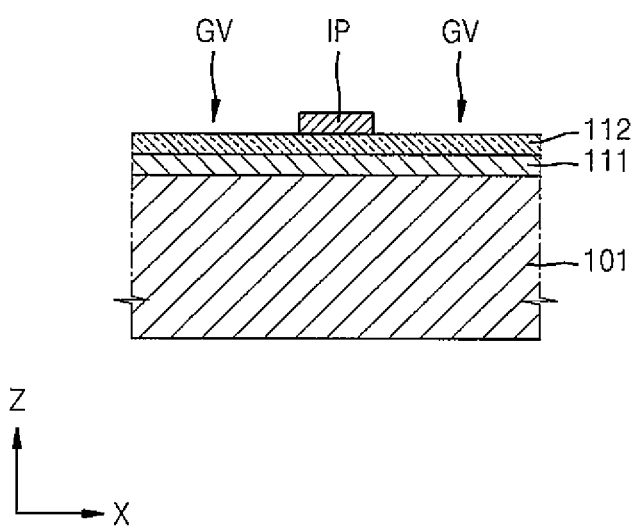
FIGS. 4, 5, and 6 illustrate modified examples of the portion D of FIG. 3.
Figure 5:
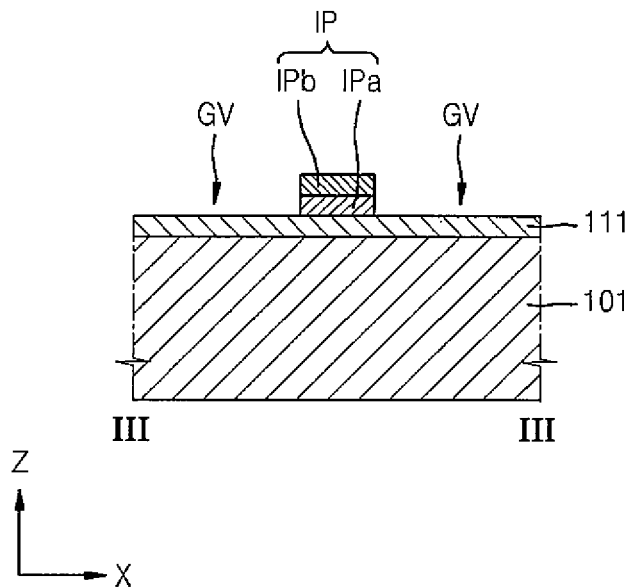
Figure 6:
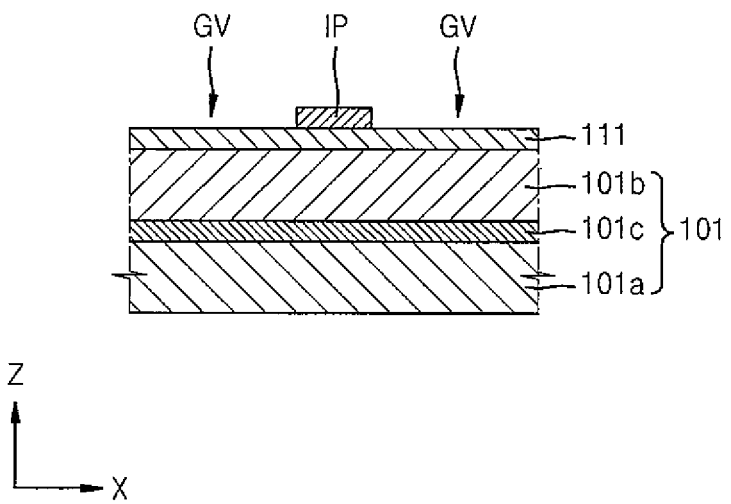

FIGS. 4 through 6 illustrate modified examples of the portion D of FIG. 3.

First, referring to FIG. 4, the first insulating layer 111 and a second insulating layer 112 are disposed between the substrate 101 and the insulation pattern IP and the groove GV. In more detail, the first insulating layer 111 is formed on the substrate 101, and the second insulating layer 112 is formed on the first insulating layer 111. The insulation pattern IP and the groove GV are formed on the second insulating layer 112.

The second insulating layer 112 may be formed of one or more of various suitable insulating materials known to those skilled in the art.

In an embodiment, the second insulating layer 112 may be formed of an inorganic material. For example, the second insulating layer 112 may include oxide, nitride, or oxynitride. In more detail, the second insulating layer 112 may include silicon nitride ($SiN_x$), silicon oxide ($SiO_2$), or silicon oxynitride ($SiO_xN_y$).

Although not illustrated, in an embodiment, at least three insulating layers may be stacked between the substrate 101 and the insulation pattern IP and the groove GV.

Referring to FIG. 5, the insulation pattern IP is not a single layer but includes multiple layers including a first layer IPa and a second layer IPb. The first layer IPa is formed on the first insulating layer 111, and the second layer IPb is formed on the first layer IPa. The first layer IPa and the second layer IPb may be formed of one or more of various suitable insulating materials known to those skilled in the art, including an organic material and an inorganic material.

In an embodiment, the first layer IPa and the second layer IPb may be formed of the same or substantially the same material.

Referring to FIG. 5, the first layer IPa and the second layer IPb have the same or substantially the same width. However, the present embodiment is not limited thereto, and thus the first layer IPa and the second layer IPb may have different widths or a portion of a top surface of the first layer IPa may not be covered by the second layer IPb.

Although not illustrated, in an embodiment, the second insulating layer 112 of FIG. 4 may be further disposed in a structure shown in FIG. 5. For example, the second insulating layer 112 may be further disposed between the first layer IPa and the first insulating layer 111.

Referring to FIG. 6, the substrate 101 is not a single layer but includes multiple layers including a first layer 101a, a second layer 101b, and an insertion layer 101c. The first layer 101a and the second layer 101b may include an organic material, and the insertion layer 101c may include an inorganic material. In an embodiment, the first layer 101a and the second layer 101b may include a plastic material such as polyimide, and the insertion layer 101c may include silicon oxide.

However, the present invention is not limited thereto, and the first layer 101a and the second layer 101b may include one or more of various suitable types of same or different organic materials known to those skilled in the art. The insertion layer 101c may include one or more of various suitable materials known to those skilled in the art that are capable of functioning as a barrier, and may not have a single-layered structure but may have a multi-layered structure.

Although not illustrated, the multi-layered structure of the substrate 101 shown in FIG. 6 may be applied to one or more of the structures of FIGS. 4 and 5.

Figure 7:
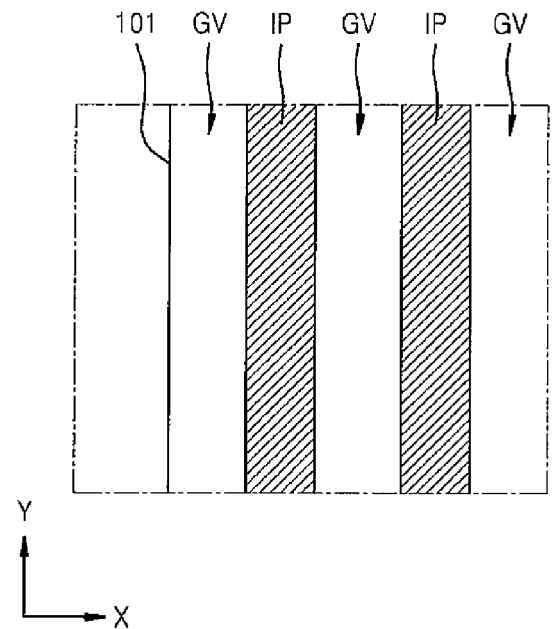
FIGS. 7 and 8 illustrate modified examples of the portion D of FIG. 2.
Figure 8:
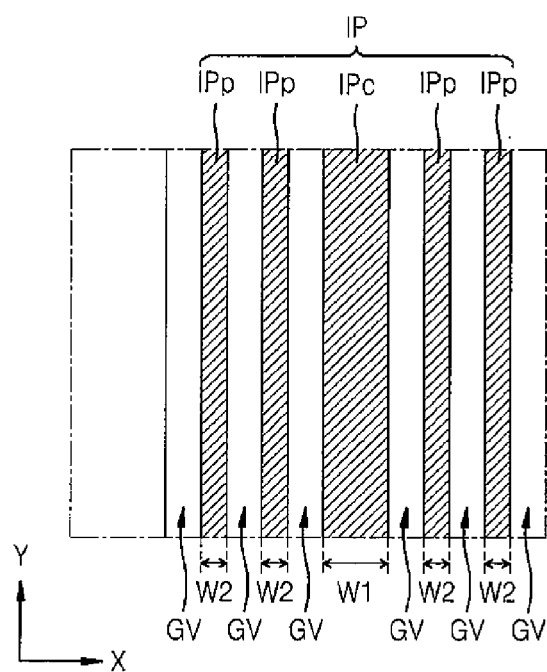

FIGS. 7 and 8 illustrate modified examples of the portion D of FIG. 2.

Referring to FIG. 7, a plurality of insulation patterns IP are formed. Although FIG. 7 illustrates two insulation patterns IP, the present embodiment is not limited thereto. That is, at least three insulation patterns IP may be formed.

In an embodiment, the plurality of insulation patterns IP may be arranged in one direction, e.g., arranged along a width direction (an X-axis direction of FIG. 7) of the plurality of insulation patterns IP.

Also, grooves GV are formed to be adjacent to the plurality of insulation patterns IP.

In an embodiment, the plurality of insulation patterns IP may be formed in parallel to each other and may have a regular width (e.g., a uniform width). Also, the plurality of insulation patterns may have a uniform width or different widths according to each of areas.

Other configurations of the insulation pattern IP are the same or substantially the same as those that are described in the previous embodiment, and thus detailed descriptions thereof are omitted here.

The plurality of insulation patterns IP and the grooves GV formed therebetween may efficiently block or substantially prevent crack propagation to the substrate 101 via a cutting line CL of the substrate 101. That is, crack occurrence may be reduced or minimized due to a groove GV that is adjacent to a cutting line CL, i.e., an edge of the substrate 101, an insulation pattern IP that is adjacent to the groove GV adjacent to the cutting line CL may block or reduce the crack occurrence, a groove GV that is adjacent to the insulation pattern IP may block or reduce propagation of the crack occurrence, and an insulation pattern IP that is adjacent to the groove GV may additionally block or reduce the crack occurrence and the propagation of the crack occurrence.

Referring to FIG. 8, an insulation patterns IP is formed. The insulation patterns IP shown in FIG. 8 includes a central insulation pattern IPc and peripheral insulation patterns IPp.

The peripheral insulation patterns IPp are disposed around the central insulation pattern IPc. That is, the peripheral insulation patterns IPp are disposed between a cutting line CL of the substrate 101 and the central insulation pattern IPc, and are disposed between the central insulation pattern IPc and the display area (DA).

Referring to FIG. 8, two peripheral insulation patterns IPp are formed at each side of the central insulation pattern IPc, but the present invention is not limited thereto. That is, at least three peripheral insulation patterns IPp may be formed at each side of the central insulation pattern IPc.

The central insulation pattern IPc has a width W1, and each of the peripheral insulation patterns IPp has a width W2.

In an embodiment, the width W1 and the width W2 may be different from each other. For example, the width W1 may be greater than the width W2.

Since the width W1 of the central insulation pattern IPc is greater than the width W2 of the peripheral insulation pattern IPp, the crack that may be propagated via the peripheral insulation pattern IPp may be efficiently blocked or substantially prevented by the central insulation pattern IPc.

Also, since the width W1 and the width W2 are different from each other, when the display apparatus 1000 is bent, flexibility of the display apparatus 1000 may be increased.

In an embodiment, the central insulation pattern IPc and the peripheral insulation pattern IPp may be formed in parallel to each other.

Other configurations of the insulation pattern IP are the same or substantially the same as those that are described in the previous embodiment, and thus detailed descriptions thereof are omitted here.

Figure 9:
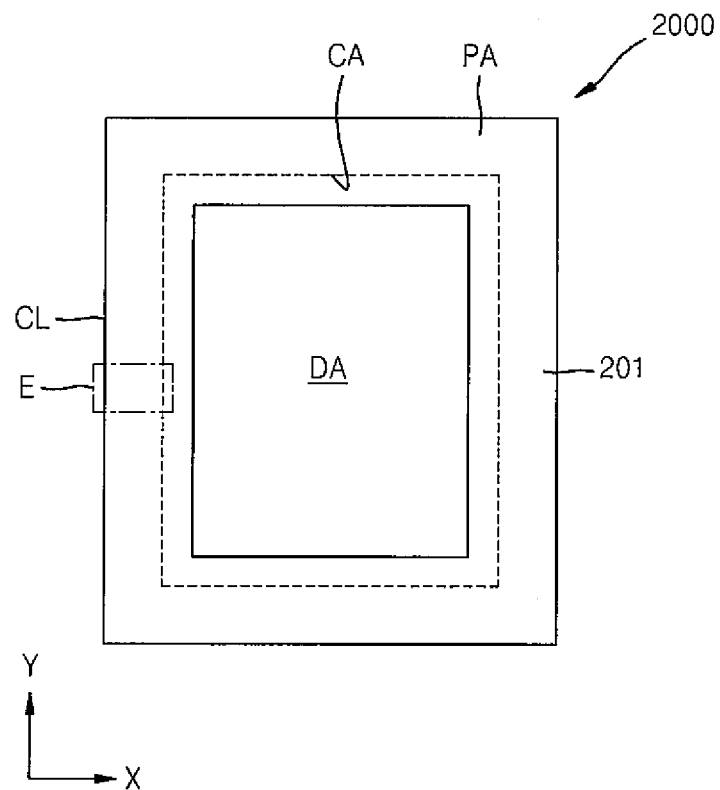
FIG. 9 illustrates a plan view of a display apparatus according to another embodiment of the present invention.
Figure 10:
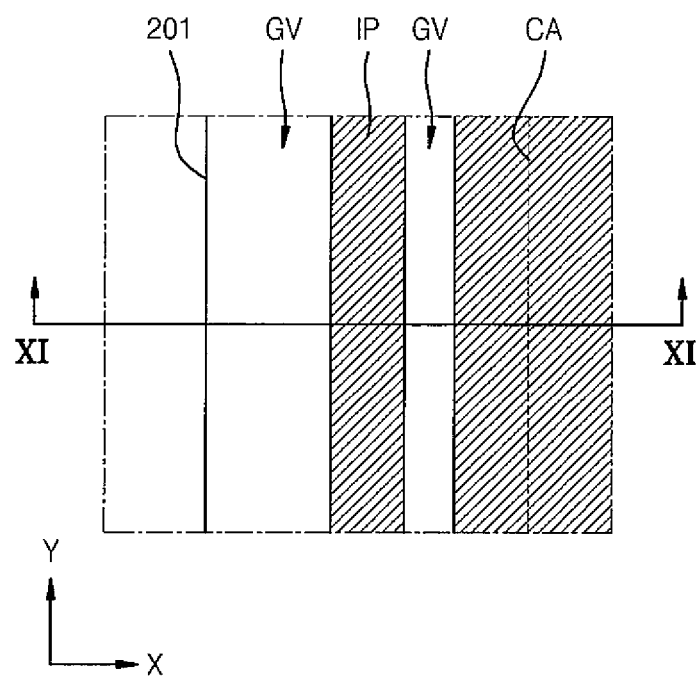
FIG. 10 illustrates a magnified view of a portion E of FIG. 9.

FIG. 9 illustrates a plan view of a display apparatus 2000 according to another embodiment of the present invention. FIG. 10 illustrates a magnified view of a portion E of FIG. 9, and FIG. 11 illustrates a cross-sectional view of the portion E, taken along the line XI-XI of FIG. 10.

Figure 11:
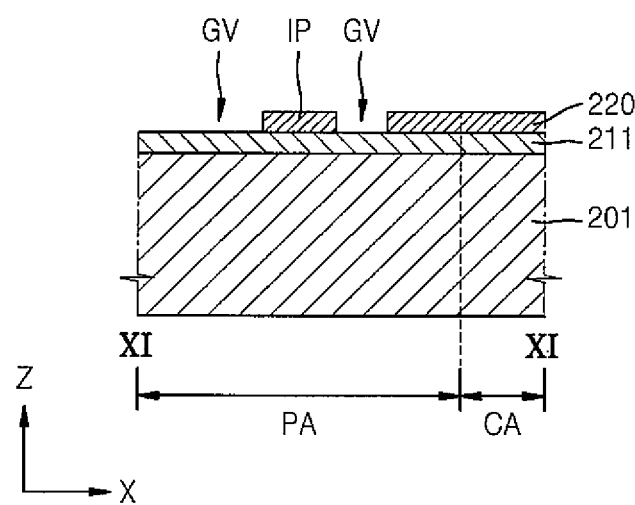
FIG. 11 illustrates a cross-sectional view of the portion E, taken along the line XI-XI of FIG. 10.

Referring to FIGS. 9 through 11, the display apparatus 2000 according to the present embodiment includes a substrate 201. The substrate 201 may include one or more of various suitable materials known to those skilled in the art. Detailed examples of the various suitable materials of the substrate 201 are the same or substantially the same as those described in the previous embodiment, and thus detailed descriptions thereof are omitted here.

A plurality of the display apparatuses 2000 may be formed on a mother substrate, and may be separated into each display apparatus 2000 in a manner that the mother substrate is cut along cutting lines CL of the substrates 201. FIG. 9 illustrates one display apparatus 2000 that is cut along the cutting line CL and thus is separated. Thus, an edge of the substrate 201 is defined by the cutting line CL.

All edges of the substrate 201, i.e., four edges of the substrate 201 shown in FIG. 9, may be cutting lines CL. In an embodiment, one, two, or three of the four edges of the substrate 201 may be cutting lines CL.

That is, according to a size and/or shape of the mother substrate and/or a number, shapes and sizes of the substrates to be produced therefrom, a position or the number of edges from among all edges of the display apparatus 2000 that are determined as a cutting line CL may vary.

The substrate 201 is partitioned into a peripheral area PA and a central area CA. In more detail, the peripheral area PA refers to an area around the cutting line CL, and the central area CA refers to an area that is inwardly positioned, compared to the peripheral area PA.

However, the present embodiment is not limited thereto. That is, the cutting line CL may not exist. In more detail, one display apparatus 2000 may be formed on a mother substrate, and in this case, the substrate 201 may correspond to the mother substrate, so that the cutting line CL may not exist. In this case, the peripheral area PA may refer to an area adjacent to an edge of the substrate 201, and the central area CA may refer to an area that is inwardly positioned, compared to the peripheral area PA. For convenience of description, it is assumed that the cutting line CL exists in embodiments to be described below.

The central area CA may include at least one display area DA.

The display area DA may have at least one display device (not specified in FIG. 9), e.g., an OLED for displaying an image. Also, a plurality of pixels may be arranged in the display area DA.

A non-display area (not specified in FIG. 9) may be formed around the display area DA. In more detail, the non-display area may be formed to surround the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not specified in FIG. 9) may be formed in the non-display area. In this regard, a driver or a plurality of pad units (not specified in FIG. 9) may be disposed in the pad area.

At least one insulating layer (not specified in FIG. 9) may be formed in the central area CA so as to prevent or substantially prevent moisture or impurities from penetrating into the display apparatus 2000 via the substrate 201. That is, as illustrated in FIG. 11, a central insulating layer 220 may be formed in the central area CA on the substrate 201.

In an embodiment, the central insulating layer 220 may be formed to be extending from the central area CA to a portion of the peripheral area PA. In another embodiment, a portion of the central insulating layer 220 may be formed in a portion of the peripheral area PA while the portion of the central insulating layer 220 is partially separate (e.g., spaced) from the central insulating layer 220 formed in the central area CA.

The central insulating layer 220 may include one or more of various suitable insulating materials known to those skilled in the art, e.g., an inorganic material.

The peripheral area PA refers to an area around the cutting line CL and is arranged at edges of the substrate 201 along the cutting line CL.

An insulation pattern IP is formed in the peripheral area PA. A groove GV from which a material for forming the insulation pattern IP is removed is formed adjacent to the insulation pattern IP.

A first insulating layer 211 is disposed between the substrate 201 and the insulation pattern IP and the groove GV. That is, in the peripheral area PA, the first insulating layer 211 is formed on the substrate 201, and the insulation pattern IP and the groove GV are formed on the first insulating layer 211. The first insulating layer 211 may be formed of one or more of various suitable insulating materials known to those skilled in the art, and in this regard, all of (or at least one of) materials that are described in the previous embodiment may be used.

In an embodiment, due to the first insulating layer 211, a top surface of the substrate 201 is not exposed in the peripheral area PA. That is, the first insulating layer 211 may be formed to be extending to the cutting line CL of the substrate 201.

However, one or more embodiments of the present invention are not limited thereto, and the first insulating layer 211 may not cover the top surface of the substrate 201 in a portion of the peripheral area PA.

In an embodiment, the first insulating layer 211 may extend to the central area CA. Also, the first insulating layer 211 may be disposed between the substrate 201 and the central insulating layer 220.

The insulation pattern IP may be formed of one or more of various suitable materials known to those skilled in the art. For example, the insulation pattern IP may be formed of an inorganic or organic material. In an embodiment, the insulation pattern IP may be formed from the same material or substantially the same material as at least one of insulating materials that may be formed in the central area CA of the substrate 201.

In an embodiment, the insulation pattern IP may be formed from the same material or substantially the same material as the central insulating layer 220. By doing so, the insulation pattern IP and the central insulating layer 220 may be concurrently (e.g., simultaneously) formed.

In an embodiment, the insulation pattern IP and the central insulating layer 220 may be formed of an inorganic material.

The groove GV is located between the insulation pattern IP and the cutting line CL of the substrate 201. The groove GV is located adjacent to the cutting line CL of the substrate 201, and the insulation pattern IP is separate (e.g., spaced) from the cutting line CL of the substrate 201. Also, another groove GV is formed between the insulation pattern IP and the central insulating layer 220.

The features of the groove GV and the insulation pattern IP are the same or substantially the same as those described in the previous embodiment, and thus detailed descriptions thereof are omitted here. In an embodiment, although not illustrated, a plurality of insulation patterns IP may be arranged in one direction, e.g., a width direction (along an X-axis direction of FIG. 10) of the insulation pattern IP. That is, one or more of the structures shown in FIGS. 7 and 8 may be applied to the display apparatus 2000.

Although not illustrated, in addition to the first insulating layer 211, at least one insulating layer (not shown) may be further disposed between the substrate 201 and the insulation pattern IP and the groove GV, as illustrated in FIG. 4. The at least one insulating layer may be formed of one or more of various suitable insulating materials known to those skilled in the art, e.g., an inorganic material.

Figure 12:
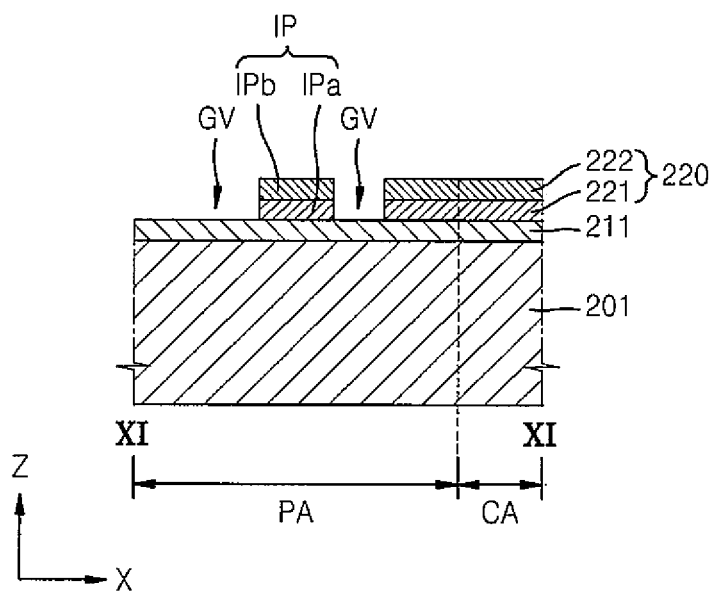
FIG. 12 illustrates a modified example of the portion E of FIG. 11.

FIG. 12 illustrates a modified example of the portion E of FIG. 11.

Referring to FIG. 12, an insulation pattern IP is not a single layer but includes multiple layers including a first layer IPa and a second layer IPb. The first layer IPa is formed on the first insulating layer 211, and the second layer IPb is formed on the first layer IPa. The first layer IPa and the second layer IPb are formed of one or more of various suitable insulating materials known to those skilled in the art, e.g., an organic or inorganic material.

In an embodiment, the first layer IPa and the second layer IPb may be formed of the same or substantially the same material.

In an embodiment, the central insulating layer 220 may be formed to be extending from the central area CA to a portion of the peripheral area PA. In another embodiment, a portion of the central insulating layer 220 may be formed at a portion of the peripheral area PA while the portion of the central insulating layer 220 is partially separate (e.g., spaced) from the central insulating layer 220 formed at the central area CA.

The central insulating layer 220 may include one or more of various suitable insulating materials known to those skilled in the art, e.g., an inorganic material.

In an embodiment, the insulation pattern IP may be formed from the same or substantially the same material as the central insulating layer 220. By doing so, the insulation pattern IP and the central insulating layer 220 may be concurrently (e.g., simultaneously) formed.

In an embodiment, the insulation pattern IP and the central insulating layer 220 may be formed of an inorganic material.

In more detail, the central insulating layer 220 includes the first central insulating layer 221 and a second central insulating layer 222. The first layer IPa of the insulation pattern IP may be formed from the same material or substantially the same material as the first central insulating layer 221, and the second layer IPb may be formed from the same material or substantially the same material as the second central insulating layer 222.

By doing so, the first layer IPa and the first central insulating layer 221 may be concurrently (e.g., simultaneously) formed, and the second layer IPb and the second central insulating layer 222 may be concurrently (e.g., simultaneously) formed.

Also, in an embodiment, the first layer IPa and the second layer IPb may be concurrently (or simultaneously) formed. In another embodiment, when the first layer IPa and the second layer IPb are concurrently (e.g., simultaneously) formed, the first layer IPa and the second layer IPb may be concurrently (e.g., simultaneously) formed with the first central insulating layer 221 and the second central insulating layer 222.

Referring to FIG. 12, the first layer IPa and the second layer IPb have the same width or substantially the same width. However, the present invention is not limited thereto, and the first layer IPa and the second layer IPb may have different widths, and a portion of a top surface of the first layer IPa may not be covered by the second layer IPb.

Referring to FIGS. 11 and 12, the substrate 201 is formed as a single layer, but the present invention is not limited thereto. As in the embodiment of FIG. 6, the substrate 201 may not be formed as the single layer but may be formed as multiple layers including a first layer (not shown), a second layer (not shown), and an insertion layer (not shown). The features of the first layer, the second layer, and the insertion layer are the same or substantially the same as those described with reference to FIG. 6, and thus detailed descriptions thereof are omitted here.

Figure 13:
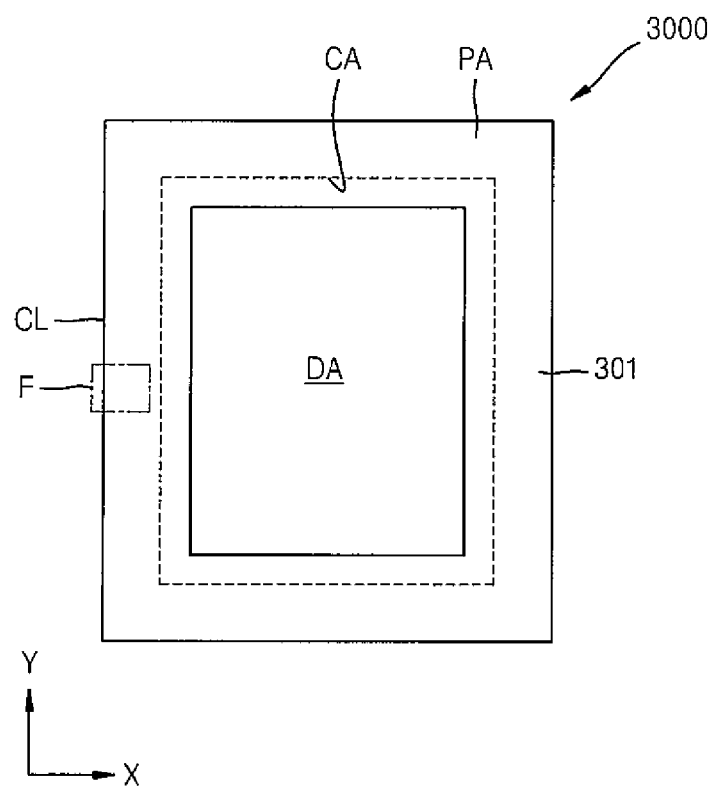
FIG. 13 illustrates a plan view of a display apparatus according to another embodiment of the present invention.
Figure 14:
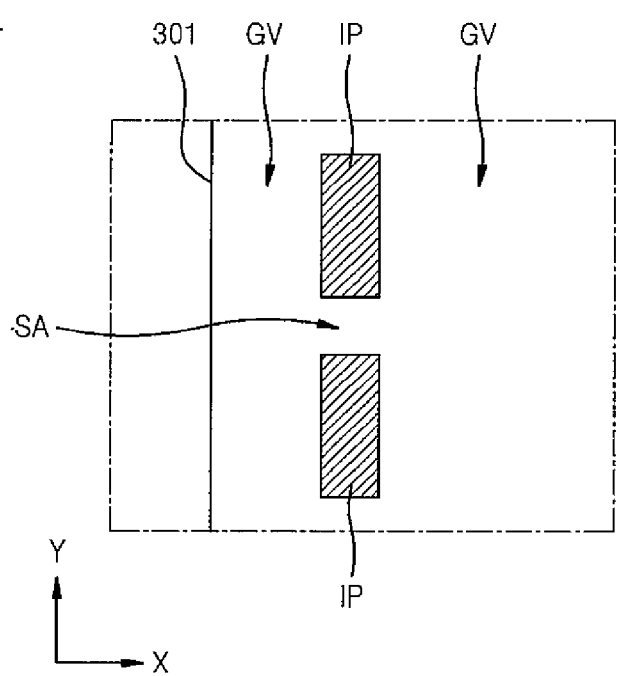
FIG. 14 illustrates a magnified view of a portion F of FIG. 13.

FIG. 13 illustrates a plan view of a display apparatus 3000 according to another embodiment of the present invention. FIG. 14 illustrates a magnified view of a portion F of FIG. 13.

Referring to FIGS. 13 and 14, the display apparatus 3000 according to the present embodiment includes a substrate 301. The substrate 301 may include one or more of various suitable materials known to those skilled in the art. Detailed examples of the various suitable materials of the substrate 301 are the same or substantially the same as those described in the previous embodiment, and thus detailed descriptions thereof are omitted here.

A plurality of the display apparatuses 3000 may be formed on a mother substrate, and may be separated into each display apparatus 3000 in a manner that the mother substrate is cut along cutting lines CL of the substrates 301. FIG. 13 illustrates one display apparatus 3000 that is cut along the cutting line CL and thus is separated. Thus, an edge of the substrate 301 is defined by the cutting line CL.

All edges of the substrate 301, i.e., four edges of the substrate 301 shown in FIG. 13, may be cutting lines CL. In an embodiment, one, two, or three of the four edges of the substrate 301 may be cutting lines CL.

That is, according to a size and/or shape of the mother substrate and/or a number, shapes and sizes of the substrates to be produced therefrom, a position or the number of edges from among all edges of the display apparatus 3000 that are determined as a cutting line CL may vary.

The substrate 301 is partitioned into a peripheral area PA and a central area CA. In more detail, the peripheral area PA refers to an area around the cutting line CL, and the central area CA refers to an area that is inwardly positioned, compared to the peripheral area PA.

However, the present embodiment is not limited thereto. That is, the cutting line CL may not exist. In more detail, one display apparatus 3000 may be formed on a mother substrate, and in this case, the substrate 301 may correspond to the mother substrate, so that the cutting line CL may not exist. In this case, the peripheral area PA may refer to an area adjacent to an edge of the substrate 301, and the central area CA may refer to an area that is inwardly positioned, compared to the peripheral area PA. For convenience of description, it is assumed that the cutting line CL exists in embodiments to be described below.

The central area CA may include at least one display area DA.

The display area DA may include at least one display device (not specified in FIG. 13), e.g., an OLED for displaying an image. Also, a plurality of pixels may be disposed in the display area DA.

A non-display area (not specified in FIG. 13) may be formed around the display area DA. In more detail, the non-display area may be formed to surround the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not specified in FIG. 13) may be formed in the non-display area. In this regard, a driver or a plurality of pad units (not specified in FIG. 13) may be disposed in the pad area.

In an embodiment, at least one insulating layer (not specified in FIG. 13) may be formed in the central area CA so as to prevent substantially prevent moisture or impurities from penetrating into the display apparatus 3000 via the substrate 301. For example, the at least one insulating layer may include an inorganic material.

The peripheral area PA refers to the area around the cutting line CL and is arranged in edges of the substrate 301 along the cutting line CL.

An insulation pattern IP is formed in the peripheral area PA. A groove GV from which a material for forming the insulation pattern IP is removed is formed adjacent to the insulation pattern IP.

A plurality of the insulation patterns IP that are separate (e.g., spaced) from each other may be formed. That is, the plurality of the insulation patterns IP may be arranged in a direction that crosses a direction toward the display area DA from the cutting line CL that is the edge of the substrate 301. Here, a separation area SA may exist between the plurality of the insulation patterns IP, and may correspond to the groove GV.

Although not illustrated, a first insulating layer (not specified in FIG. 13) is disposed between the substrate 301 and the insulation pattern IP and the groove GV. The first insulating layer is the same or substantially the same as that is described in the previous embodiment, and thus detailed descriptions thereof are omitted here.

The groove GV is located between the insulation pattern IP and the cutting line CL of the substrate 301. The groove GV is located adjacent to the cutting line CL of the substrate 301, and the insulation pattern IP is separate from the cutting line CL of the substrate 301.

Although not specifically illustrated, one or more of the structures shown in FIGS. 4 through 12 may be applied to the display apparatus 3000.

That is, the plurality of the insulation patterns IP may be disposed in a direction (along an X-axis direction of FIG. 14) that crosses a direction (a Y-axis direction of FIG. 14) in which they are currently arranged.

Also, a plurality of insulating layers (not specified in FIG. 14) may be disposed between the substrate 301 and the insulation pattern IP and the groove GV. Also, the insulation pattern IP may not be formed as a single layer but may be formed as multiple layers.

In an embodiment, a central insulating layer (not specified in FIG. 14) may be formed to be extending from the central area CA to a portion of the peripheral area PA. In another embodiment, a portion of the central insulating layer may be formed in a portion of the peripheral area PA while the portion of the central insulating layer is partially separate (e.g., spaced) from the central insulating layer formed in the central area CA.

In an embodiment, the insulation pattern IP and the central insulating layer may be formed of the same or substantially the same material.

The substrate 301 may be formed as a single layer, but the present invention is not limited thereto. As in the embodiment of FIG. 6, the substrate 301 may not be formed as the single layer but may be formed as multiple layers including a first layer (not specified in FIG. 14), a second layer (not specified in FIG. 14), and an insertion layer (not specified in FIG. 14). The features of the first layer, the second layer, and the insertion layer are the same or substantially the same as those described with reference to FIG. 6, and thus detailed descriptions thereof are omitted here.

Figure 15:
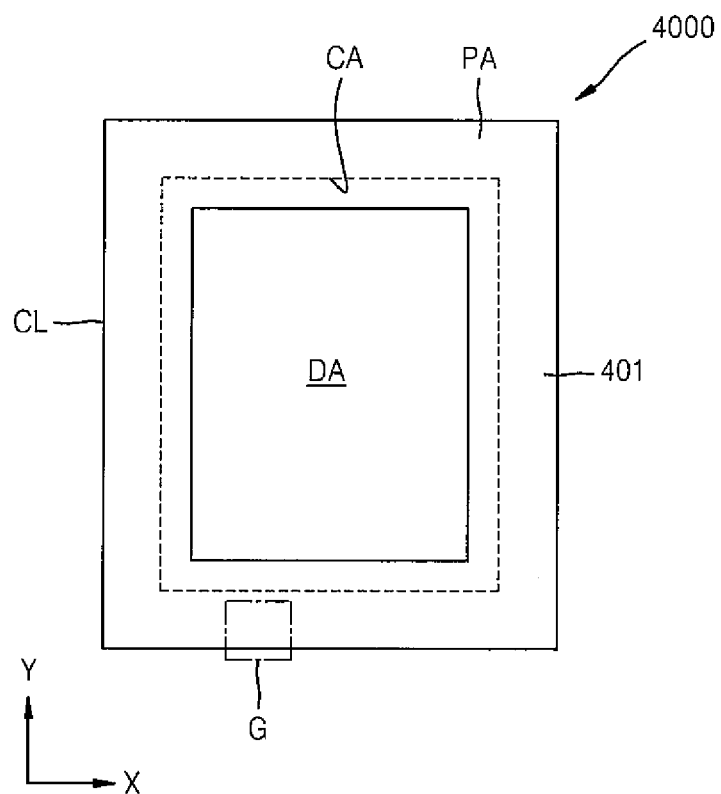
FIG. 15 illustrates a plan view of a display apparatus according to another embodiment of the present invention.

FIG. 15 illustrates a plan view of a display apparatus 4000 according to another embodiment of the present invention.

Figure 16:
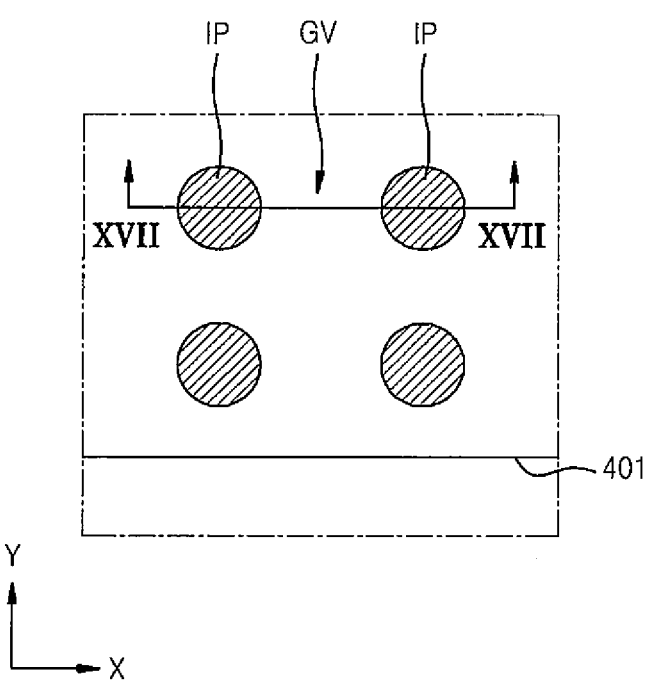
FIG. 16 illustrates a magnified view of a portion G of FIG. 15.
Figure 17:
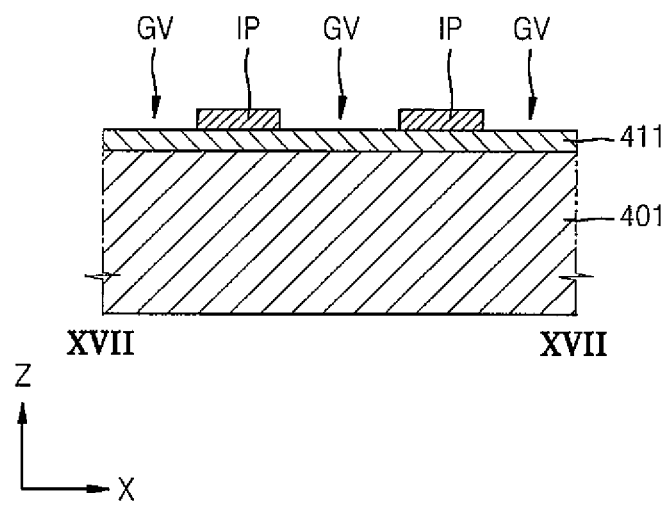
FIG. 17 illustrates a cross-sectional view of the portion G, taken along the line XVII-XVII of FIG. 16.

FIG. 16 illustrates a magnified view of a portion G of FIG. 15, and FIG. 17 illustrates a cross-sectional view of the portion G, taken along the line XVII-XVII of FIG. 16.

Referring to FIGS. 15 through 17, the display apparatus 4000 according to the present embodiment includes a substrate 401. The substrate 401 may include one or more of various suitable materials known to those skilled in the art. Detailed examples of the various suitable materials of the substrate 401 are the same or substantially the same as those described in the previous embodiment, and thus detailed descriptions thereof are omitted here.

A plurality of the display apparatuses 4000 may be formed on a mother substrate, and may be separated into each display apparatus 4000 in a manner that the mother substrate is cut along cutting lines CL of the substrates 401. FIG. 15 illustrates one display apparatus 4000 that is cut along the cutting line CL and thus is separated. Thus, an edge of the substrate 401 is defined by the cutting line CL.

All edges of the substrate 401, i.e., four edges of the substrate 401 shown in FIG. 15, may be cutting lines CL. In an embodiment, one, two, or three of the four edges of the substrate 401 may be cutting lines CL.

That is, according to a size and/or shape of the mother substrate and/or a number, shapes and sizes of the substrates to be produced therefrom, a position or the number of edges from among all edges of the display apparatus 4000 that are determined as a cutting line CL may vary.

The substrate 401 is partitioned into a peripheral area PA and a central area CA. In more detail, the peripheral area PA refers to an area around the cutting line CL, and the central area CA refers to an area that is inwardly positioned, compared to the peripheral area PA.

However, the present embodiment is not limited thereto. That is, the cutting line CL may not exist. In more detail, one display apparatus 4000 may be formed on a mother substrate, and in this case, the substrate 401 may correspond to the mother substrate, so that the cutting line CL may not exist. In this case, the peripheral area PA may refer to an area adjacent to an edge of the substrate 401, and the central area CA may refer to an area that is inwardly positioned, compared to the peripheral area PA. For convenience of description, it is assumed that the cutting line CL exists in embodiments to be described below.

The central area CA may include at least one display area DA.

The display area DA may have at least one display device (not specified in FIG. 15), e.g., an OLED for displaying an image. Also, a plurality of pixels may be arranged in the display area DA.

A non-display area (not specified in FIG. 15) may be formed around the display area DA. In more detail, the non-display area may be formed to surround the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not specified in FIG. 15) may be formed in the non-display area. In this regard, a driver or a plurality of pad units (not specified in FIG. 15) may be disposed in the pad area.

In an embodiment, at least one insulating layer (not shown) may be formed in the central area CA so as to prevent or substantially prevent moisture or impurities from penetrating into the display apparatus 4000 via the substrate 401. For example, the at least one insulating layer may include an inorganic material.

The peripheral area PA refers to the area around the cutting line CL and is arranged in edges of the substrate 401 along the cutting line CL.

An insulation pattern IP is formed in the peripheral area PA. A groove GV from which a material for forming the insulation pattern IP is removed is formed adjacent to the insulation pattern IP.

A plurality of the insulation patterns IP may correspond to a plurality of island-form patterns, respectively. In an embodiment, each insulation pattern IP may have a curved edge. In another embodiment, each insulation pattern IP may have a circular-arc edge, a round edge, or an oval edge.

In an embodiment, the plurality of the insulation patterns IP may be formed as a plurality of island form patterns that are arranged in cross-directions.

For example, the plurality of the insulation patterns IP may be arranged in a direction (along an X-axis direction of FIG. 16) that is parallel to the cutting line CL, and another direction (a Y-axis direction of FIG. 16) that crosses the direction that is parallel to the cutting line CL.

A first insulating layer 411 is disposed between the substrate 401 and the insulation pattern IP and the groove GV. The first insulating layer 411 is the same or substantially the same as that described in the previous embodiment, and thus detailed descriptions thereof are omitted here.

The groove GV is located between the insulation pattern IP and the cutting line CL of the substrate 401. The groove GV is located adjacent to the cutting line CL of the substrate 401, and the insulation pattern IP is separate (e.g., spaced) from the cutting line CL of the substrate 401.

The grooves GV are formed between the plurality of island-form insulation patterns IP, respectively. By doing so, the grooves GV widely extend (e.g., widely extend in a predetermined area), so that crack propagation via the substrate 401 may be efficiently blocked or substantially prevented.

Although not illustrated, one or more of the structures shown in FIGS. 4 through 12 may be applied to the display apparatus 4000.

Also, a plurality of insulating layers (not specified in FIG. 17) may be disposed between the substrate 401 and the insulation pattern IP and the groove GV. Also, the insulation pattern IP may not be formed as a single layer but may be formed as multiple layers including a first layer IPa (not specified in FIG. 17) and a second layer IPb (not specified in FIG. 17).

In an embodiment, the first layer IPa and the second layer IPb may be formed of the same or substantially the same material.

In an embodiment, a central insulating layer (not specified in FIG. 15) may be formed to be extending from the central area CA to a portion of the peripheral area PA. In another embodiment, a portion of the central insulating layer may be formed in a portion of the peripheral area PA while the portion of the central insulating layer is partially separate (e.g., spaced) from the central insulating layer formed in the central area CA.

In an embodiment, the insulation pattern IP and the central insulating layer may be formed of the same or substantially the same material.

While the substrate 401 is formed as a single layer, the present invention is not limited thereto. As in the embodiment of FIG. 6, the substrate 401 may not be formed as the single layer but may be formed as multiple layers including a first layer (not specified in FIG. 17), a second layer (not specified in FIG. 17), and an insertion layer (not specified in FIG. 17). The features of the first layer, the second layer, and the insertion layer are the same or substantially the same as those described with reference to FIG. 6, and thus detailed descriptions thereof are omitted here.

Figure 18:
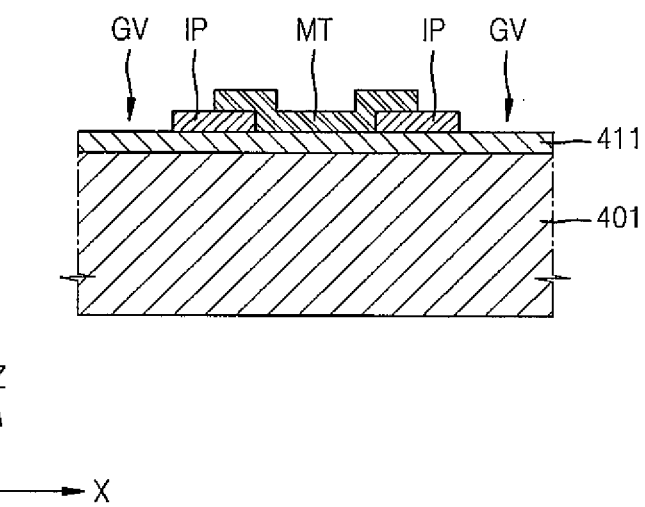
FIG. 18 illustrates a modified example of the portion G of FIG. 17.

FIG. 18 illustrates a modified example of the portion G of FIG. 17.

Referring to FIG. 18, the portion G includes a conductive pattern MT. The conductive pattern MT may be a pad unit. The conductive pattern MT is disposed in the groove GV between the plurality of insulation patterns IP. Here, the conductive pattern MT may be formed to be extending over top surfaces and/or side surfaces of the plurality of insulation patterns IP.

FIGS. 19 through 22 illustrate modified examples of FIGS. 3, 11, 18, and 21, respectively.

That is, the modified examples shown in FIGS. 19 through 22 further include cover layers on the structures of FIGS. 3, 11, 18, and 21, respectively.

Figure 19:
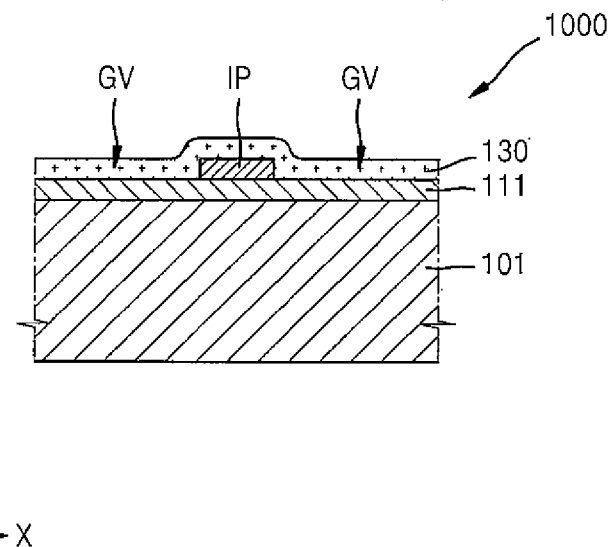
FIGS. 19, 20, 21, and 22 illustrate modified examples of FIGS. 3, 11, 18, and 21, respectively.

Referring to FIG. 19, a cover layer 130 is further formed to cover an insulation pattern IP. The cover layer 130 may be formed of one or more of various suitable materials known to those skilled in the art, e.g., an organic material. In an embodiment, the cover layer 130 may contact the first insulating layer 111. That is, the cover layer 130 may cover grooves GV.

The cover layer 130 may protect the insulation pattern IP, and may also protect the first insulating layer 111 on the substrate 101.

Although not illustrated, the cover layer 130 may also be applied to one or more of the structures shown in FIGS. 4 through 8.

Figure 20:
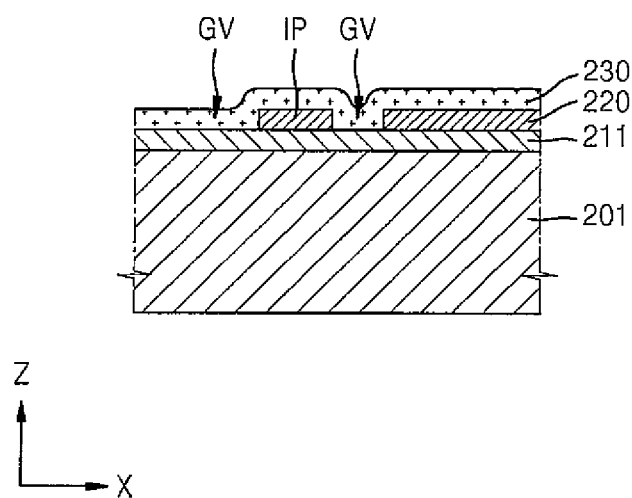

Referring to FIG. 20, a cover layer 230 is further formed to cover an insulation pattern IP. The cover layer 230 may be formed of one or more of various suitable materials known to those skilled in the art, e.g., an organic material. In an embodiment, the cover layer 230 may contact the first insulating layer 211. That is, the cover layer 230 may cover grooves GV.

The cover layer 230 may be formed even in the central area CA and thus may cover at least a portion of the central insulating layer 220.

Although not illustrated, the cover layer 230 may also be applied to one or more of the structures shown in FIGS. 12 through 17.

Figure 21:
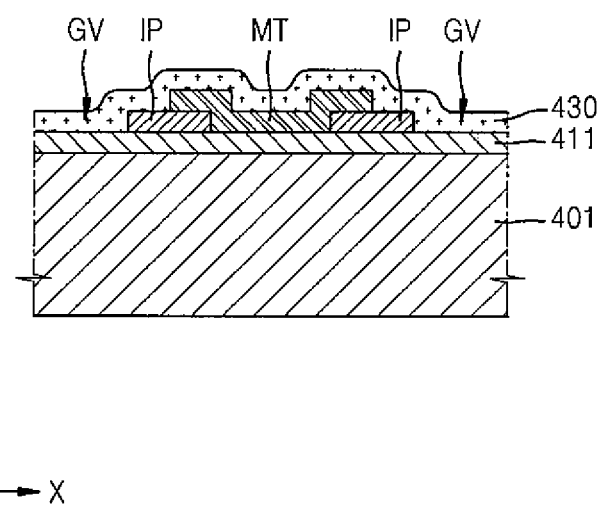

Referring to FIG. 21, a cover layer 430 is further formed to cover insulation patterns IP. The cover layer 430 may be formed of one or more of various suitable materials known to those skilled in the art, e.g., an organic material. In an embodiment, the cover layer 430 may contact the first insulating layer 411. That is, the cover layer 430 may cover grooves GV.

Also, the cover layer 430 is formed to cover a conductive pattern MT.

Figure 22:
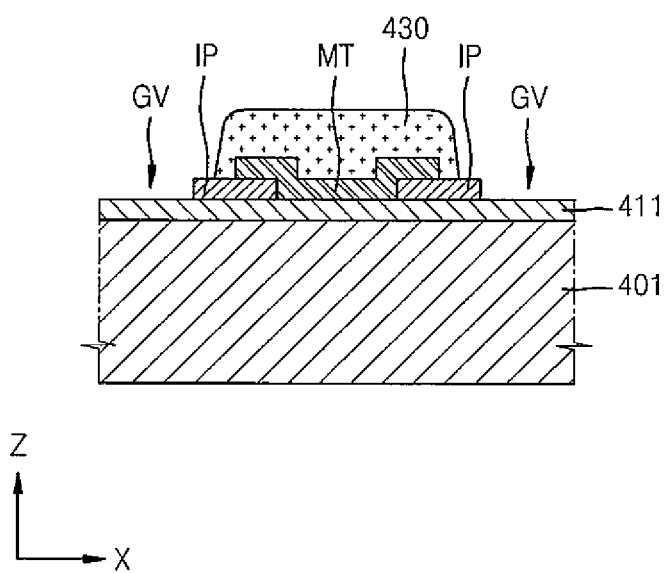

Referring to FIG. 22, the cover layer 430 may have a width sufficient to cover the conductive pattern MT. That is, some of the grooves GV may not be covered by the cover layer 430.

Figure 23:
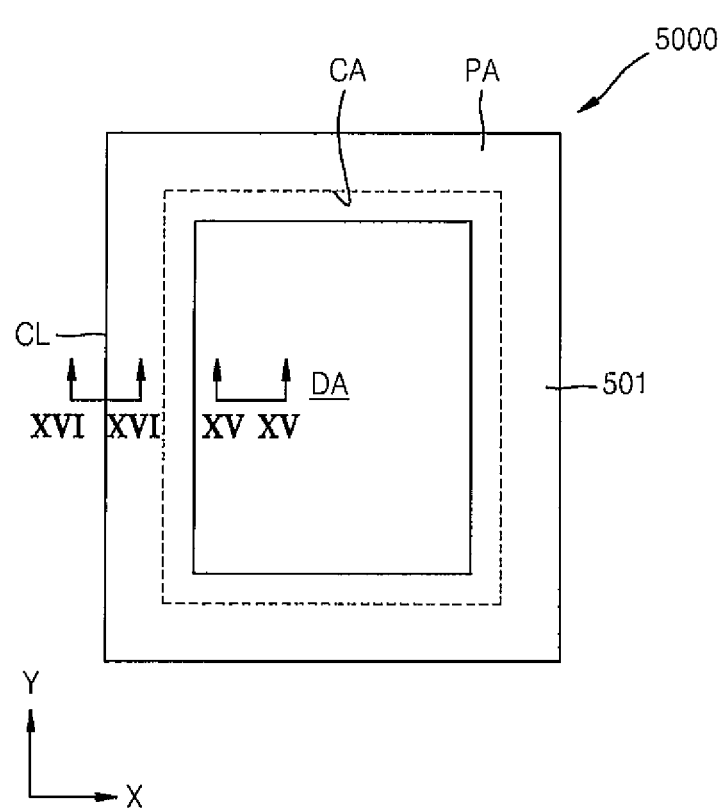
FIG. 23 illustrates a plan view of a display apparatus according to another embodiment of the present invention.
Figure 24:
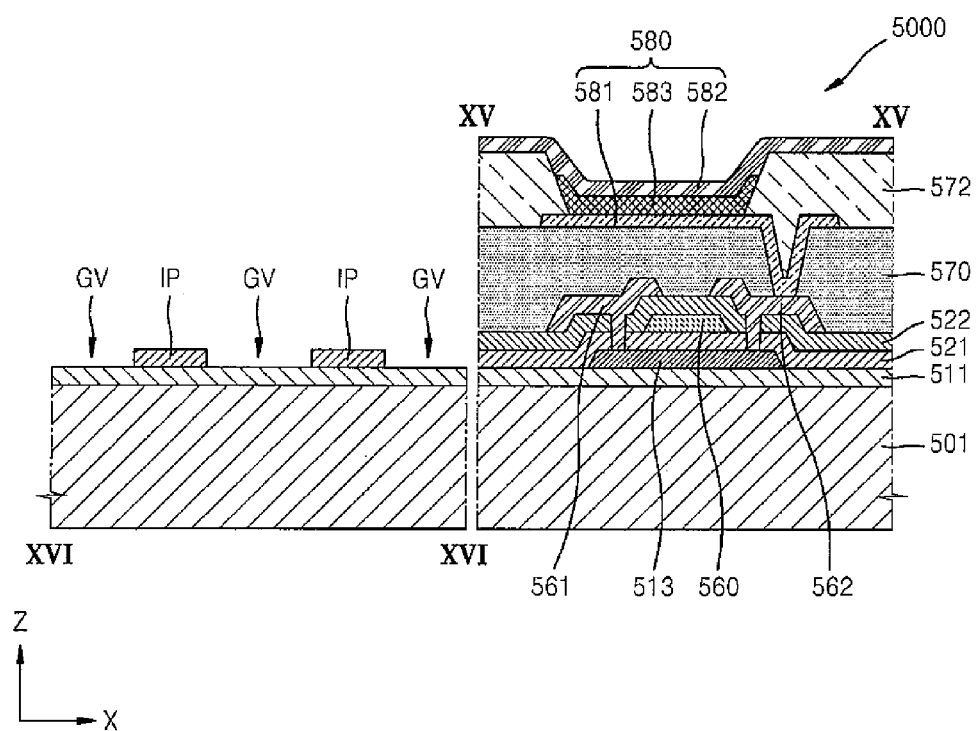
FIG. 24 illustrates cross-sectional views of the display apparatus, taken along the lines XVI-XVI and XV-XV of FIG. 23.

FIG. 23 illustrates a plan view of a display apparatus 5000 according to another embodiment of the present invention. FIG. 24 illustrates cross-sectional views of the display apparatus 5000, taken along the lines XVI-XVI and XV-XV of FIG. 23. For convenience of description, the present embodiment will be described with respect to differences from the previous embodiments.

The display apparatus 5000 according to the present embodiment includes a substrate 501. The substrate 501 may include one or more of various suitable materials known to those skilled in the art. Detailed examples of the various suitable materials of the substrate 501 are the same or substantially the same as those described in the previous embodiment, and thus detailed descriptions thereof are omitted here.

A plurality of the display apparatuses 5000 may be formed on a mother substrate, and may be separated into each display apparatus 5000 in a manner that the mother substrate is cut along cutting lines CL of the substrates 501. FIG. 23 illustrates one display apparatus 5000 that is cut along the cutting line CL and thus is separated. Thus, an edge of the substrate 501 is defined by the cutting line CL.

All edges of the substrate 501, i.e., four edges of the substrate 501 shown in FIG. 23, may be cutting lines CL. In an embodiment, one, two, or three of the four edges of the substrate 501 may be cutting lines CL.

That is, according to a size and/or shape of the mother substrate and/or a number, shapes and sizes of the substrates to be produced therefrom, a position or the number of edges from among all edges of the display apparatus 5000 that are determined as a cutting line CL may vary.

The substrate 501 is partitioned into a peripheral area PA and a central area CA. In more detail, the peripheral area PA refers to an area around the cutting line CL, and the central area CA refers to an area that is inwardly positioned, compared to the peripheral area PA.

However, the present embodiment is not limited thereto. That is, the cutting line CL may not exist. In more detail, one display apparatus 5000 may be formed on a mother substrate, and in this case, the substrate 501 may correspond to the mother substrate, so that the cutting line CL may not exist. In this case, the peripheral area PA may refer to an area adjacent to an edge of the substrate 501, and the central area CA may refer to an area that is inwardly positioned, compared to the peripheral area PA. For convenience of description, it is assumed that the cutting line CL exists in embodiments to be described below.

The central area CA may include at least one display area DA.

The display area DA may have at least one display device (not shown), e.g., an OLED for displaying an image. Also, a plurality of pixels may be arranged in the display area DA.

A non-display area (not specified in FIG. 23) may be formed around the display area DA. In more detail, the non-display area may be formed to surround the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not specified in FIG. 23) may be formed in the non-display area. In this regard, a driver or a plurality of pad units (not specified in FIG. 23) may be disposed in the pad area.

A first insulating layer 511 is formed on the substrate 501. The first insulating layer 511 may be formed in the central area CA and the peripheral area PA. In an embodiment, the first insulating layer 511 may be formed on the substrate 501, without a separate patterning process.

The first insulating layer 511 may be formed of one or more of various suitable insulating materials known to those skilled in the art. In an embodiment, the first insulating layer 511 may be formed of the inorganic material. For example, the first insulating layer 511 may include oxide, nitride, or oxynitride. In more detail, the first insulating layer 511 may include silicon nitride ($SiN_x$), silicon oxide ($SiO_2$), or silicon oxynitride ($SiO_xN_y$). Also, the first insulating layer 511 may be formed by using one or more of various suitable deposition methods known to those skilled in the art, including a plasma enhanced chemical vapor deposition (PECVD) method, an atmospheric pressure CVD (APCVD) method, a low pressure CVD (LPCVD) method, or the like.

A thin-film transistor (TFT) may be formed in the display area DA on the first insulating layer 511 and may have an active layer 513, a gate electrode 560, a source electrode 561, and a drain electrode 562. The TFT formed in the display area DA functions as a part of a pixel circuit. The TFT may also be formed in the non-display area. The TFT that is formed in the non-display area functions as a part of a circuit included in the driver.

In the present embodiment, the TFT corresponds to a top gate type TFT in which the active layer 513, the gate electrode 560, the source electrode 561, and the drain electrode 562 are sequentially formed. However, the present invention is not limited thereto, and one or more of various suitable types of TFTs including a bottom gate type TFT may be used as the TFT.

The active layer 513 is formed on the first insulating layer 511. The active layer 513 may include a semiconductor material, e.g., amorphous silicon or polycrystalline silicon. However, the present invention is not limited thereto, and the active layer 513 may include one or more of various suitable materials known to those skilled in the art. In an embodiment, the active layer 513 may include an organic semiconductor material.

In another embodiment, the active layer 513 may include an oxide semiconductor material. For example, the active layer 513 may include oxide including a material selected from metal elements of groups 12, 13, and 14 including zinc (Zn), indium (In), gallium (Ga), tin (Sn), cadmium (Cd), germanium (Ge), and hafnium (Hf), and a composition thereof.

As described above, the present embodiment may include one or more of various types of TFTs, e.g., a bottom gate type TFT. For example, if the active layer 513 includes oxide or amorphous silicon, the present embodiment may include the bottom gate type TFT.

The bottom gate type TFT may have one or more of various suitable structures known to those skilled in the art. For one example, a gate electrode may be formed on the first insulating layer 511, an active layer may be formed on the gate electrode, and a source electrode and a drain electrode may be disposed on the active layer. For another example, the gate electrode may be formed on a substrate, the source electrode and the drain electrode may be formed on the gate electrode, and the active layer may be formed on the source electrode and the drain electrode. In this case, an insulating layer, e.g., an inorganic layer, may be formed to be adjacent to at least one of the gate electrode, the active layer, and the source electrode and the drain electrode.

A gate insulating layer 521 is formed on the active layer 513. The gate insulating layer 521 may be formed as multiple layers or a single layer including an inorganic material such as silicon oxide and/or silicon nitride. The gate insulating layer 521 insulates the active layer 513 from the gate electrode 560.

In an embodiment, an insulation pattern IP may be formed of the same or substantially the same material as the gate insulating layer 521. Also, the gate insulating layer 521 and the insulation pattern IP may be concurrently (e.g., simultaneously) formed.

The patterned gate electrode 560 is formed on the gate insulating layer 521. The gate electrode 560 may be connected to a gate line (not specified in FIG. 24) that applies an ON signal or an OFF signal to the TFT.

The gate electrode 560 may be formed of a low resistance metal material. For example, the gate electrode 560 may be formed as multiple layers or a single layer including a conductive material including molybdenum (Mo), aluminum (Al), copper (Cu), or Titanium (Ti).

An interlayer insulating layer 522 is formed on the gate electrode 560. The interlayer insulating layer 522 insulates the gate electrode 560 from the source electrode 561 and the drain electrode 562.

The interlayer insulating layer 522 may be formed as multiple layers or a single layer including an inorganic material. For example, the inorganic material may be metal oxide or metal nitride, in more detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$).

The source electrode 561 and the drain electrode 562 are formed on the interlayer insulating layer 522. Each of the source electrode 561 and the drain electrode 562 may be formed as a single layer or multiple layers including a highly conductive material.

The source electrode 561 and the drain electrode 562 are formed to contact the active layer 513.

A passivation layer 570 is formed on the source electrode 561 and the drain electrode 562 so as to cover the TFT.

The passivation layer 570 may remove a step caused by the TFT, provide a planarized layer over the TFT, and thus may prevent or reduce occurrence of a defective OLED due to unevenness caused by the TFT. The passivation layer 570 may be formed as a single layer or multiple layers including an organic material. The organic material may include polymer derivatives having commercial polymers such as Polymethylmethacrylate (PMMA) or Polystyrene (PS), and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof. Also, the passivation layer 570 may be formed as a multi-stack including an inorganic insulating layer and an organic insulating layer.

A cover layer (not specified in FIG. 24) in the previous embodiments may be applied to the display apparatus 5000, and in this case, the cover layer and the passivation layer 570 may be formed of the same or substantially the same material.

An OLED 580 is formed on the passivation layer 570. The OLED 580 is electrically connected to the TFT.

The OLED 580 includes a first electrode 581, a second electrode 582, and an intermediate layer 583 disposed between the first electrode 581 and the second electrode 582.

The first electrode 581 is electrically connected to one of the source electrode 561 and the drain electrode 562. Referring to FIG. 24, the first electrode 581 may be electrically connected to the drain electrode 562.

The first electrode 581 may have one or more of various suitable forms. For example, the first electrode 581 may be patterned as an island form.

The first electrode 581 may be formed of one or more of various suitable materials known to those skilled in the art. That is, the first electrode 581 may include at least one selected from the group of transparent conductive oxide materials including indium tin oxide (ITO), indium zinc oxide (IZO), zinc oxide (ZnO), indium oxide ($In_2O_3$), indium gallium oxide (IGO), and aluminum zinc oxide (AZO). Also, the first electrode 581 may include metal such as silver (Ag) having high reflectance.

The intermediate layer 583 may include an organic emission layer including a small molecular organic material or a polymer molecular organic material. In an embodiment, the intermediate layer 583 includes the organic emission layer and may further include one or more layers selected from the group consisting of a hole injection layer, a hole transport layer, an electron transport layer, and an electron injection layer.

The organic emission layer may be formed in each of OLEDs. In this case, the OLEDs may emit red light, green light, and blue light, respectively. However, one or more embodiments of the present invention are not limited thereto, and the organic emission layer may be commonly formed in the OLEDs. For example, a plurality of organic emission layers that emit red light, green light, and blue light may be vertically stacked or mixed and thus may emit white light. As those skilled in the art would recognize, color combination for emitting white light is not limited to the aforementioned description. In this case, a color conversion layer or a color filter may be separately arranged to convert the emitted white light to another color (e.g., to a predetermined color).

The second electrode 582 may be formed of one or more of various suitable conductive materials known to those skilled in the art. For example, the second electrode 582 may be formed as multiple layers or a single layer including at least one of lithium (Li), calcium (Ca), lithium fluoride (LiF), aluminum (Al), magnesium (Mg), silver (Ag), and an alloy including at least two of these materials.

A pixel-defining layer 572 is formed on the passivation layer 570. In more detail, the pixel-defining layer 572 is formed while not covering an area (e.g., a predetermined area) of the first electrode 581, the intermediate layer 583 is formed on the area (e.g., the predetermined area) of the first electrode 581 that is not covered by the pixel-defining layer 572, and the second electrode 582 is formed on the intermediate layer 583.

The pixel-defining layer 572 may be formed of at least one inorganic insulating material selected from the group consisting of polyimide, polyamide, an acryl resin, benzocyclobutene, and a phenol resin by using a spin coating method.

In an embodiment, the cover layer in the previous embodiments may be applied to the display apparatus 5000, and in this case, the cover layer and the pixel-defining layer 572 may be formed of the same or substantially the same material.

Although not illustrated on the second electrode 582, in an embodiment, a functional layer (not specified in FIG. 24) may be further formed thereon. The functional layer may include a plurality of layers formed on the second electrode 582. In this regard, at least one layer of the functional layer may protect the second electrode 582 when an encapsulation member is formed later, and another layer of the functional layer may improve an efficiency of visible light that is discharged from the intermediate layer 583 to the second electrode 582.

Also, on the second electrode 582 (or, on the functional layer, if the functional layer is formed), the encapsulation member may be further formed to prevent or substantially prevent external moisture and air from penetrating into the OLED 580. The encapsulation member may be a thin film having a structure in which an inorganic layer including silicon oxide (SiOx) or silicon nitride (SiNx) and an organic layer including epoxy or polyimide are alternately stacked. However, the present invention is not limited thereto, and the encapsulation member may include a layer formed of a low melting glass.

The present invention is not limited to the structure, and the encapsulation member formed of one or more of various suitable materials known to those skilled in the art, may be formed on the OLED 580.

A groove GV that is adjacent to the cutting line CL of the substrate 501 and is arranged in the peripheral area PA of the display apparatus 5000 prevents or reduces a crack that propagates from an edge of the substrate 501. For example, the groove GV that is adjacent to the cutting line CL of the substrate 501 prevents or reduces propagation of a crack that may occur on the substrate 501 when each display apparatus 5000 is cut and separated from the mother substrate.

The insulation pattern IP is adjacent to the groove GV that is adjacent to the cutting line CL of the substrate 501, and thus secondly prevents or reduces the propagation of the crack. Also, the insulation pattern IP may improve durability of the peripheral area PA. In particular, when the substrate 501 is formed of a flexible material and thus the display apparatus 5000 has flexibility, the insulation pattern IP may efficiently protect the peripheral area PA while a curving or bending motion occurs at the peripheral area PA.

Also, the insulation pattern IP and an insulating layer of the central area CA may be formed of the same or substantially the same material. In an embodiment, the insulation pattern IP and the gate insulating layer 521 in the display area DA may be formed of the same or substantially the same material, or in another embodiment, the insulation pattern IP and the gate insulating layer 521 may be concurrently (e.g., simultaneously) formed, so that the insulation pattern IP may be conveniently formed, and thus a separate patterning process using a mask may not be added.

Although it is described that the insulation pattern IP and the gate insulating layer 521 are concurrently (e.g., simultaneously) formed, the present invention is not limited thereto. That is, the insulation pattern IP and another insulating layer, i.e., the interlayer insulating layer 522, may be formed of the same or substantially the same material.

The present embodiment may include one or more of various suitable types of TFTs, and in this regard, the insulation pattern IP may be formed of the same or substantially the same material as an insulating layer of the TFT, the insulating layer being adjacent to one of an active layer, a gate electrode, a source electrode, and a drain electrode. In an embodiment, the insulation pattern IP and the insulating layer of the TFT may be concurrently (e.g., simultaneously) formed.

Figure 25:
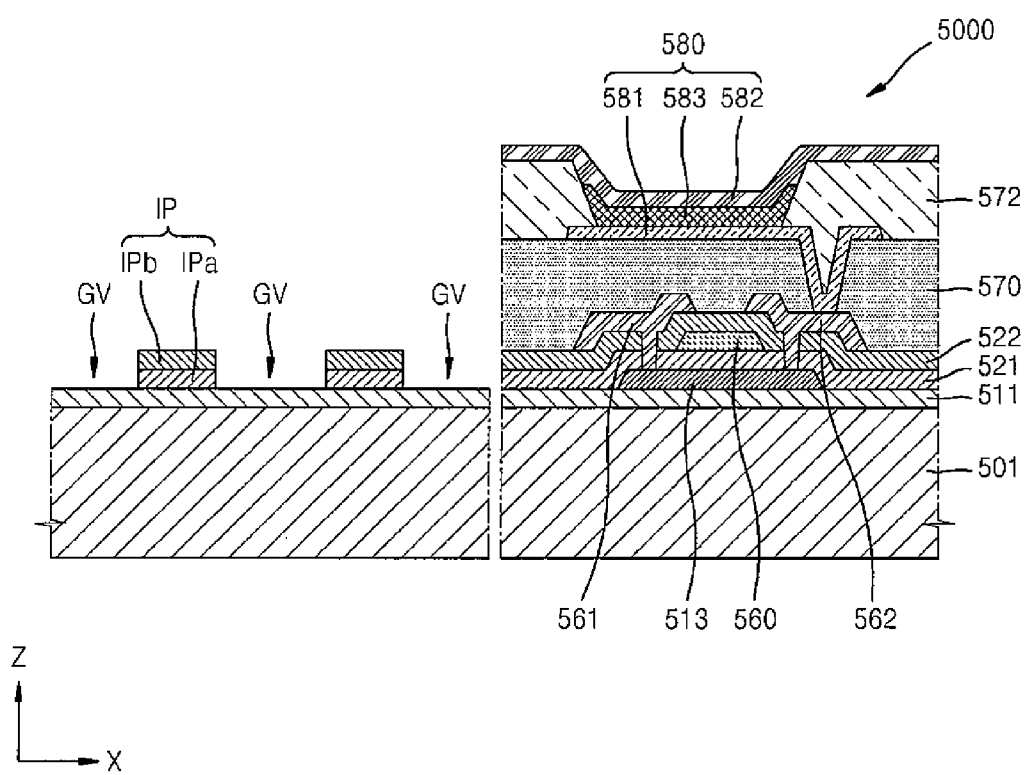
FIG. 25 illustrates a modified example of the display apparatus of FIG. 24.

FIG. 25 illustrates a modified example of the display apparatus 5000 of FIG. 24. For convenience of description, the present embodiment will be described with respect to differences from the previous embodiments.

Referring to FIG. 25, similar to the embodiments of FIGS. 5 and 12, the display apparatus 5000 has an insulation pattern IP that is not formed as a single layer but is formed as multiple layers including a first layer IPa and a second layer IPb.

The first layer IPa is formed on a first insulating layer 511, and the second layer IPb is formed on the first layer IPa. The first layer IPa and the second layer IPb may be formed of one or more of various suitable insulating materials known to those skilled in the art, e.g., an organic material or an inorganic material.

In an embodiment, the first layer IPa and the second layer IPb may be formed from the same or substantially the same material as the central area CA, in more detail, a gate insulating layer 521 and an interlayer insulating layer 522 formed in the display area DA.

In the described embodiment, the first layer IPa and the second layer IPb, and the gate insulating layer 521 and the interlayer insulating layer 522 may be concurrently (e.g., simultaneously) formed, so that the insulation pattern IP may be conveniently formed, and in particular, a separate patterning process using a mask may not be added.

Although not illustrated, the modified example of the display apparatus 5000 of FIG. 24 may include one or more of various suitable structures other than the structure shown in FIG. 25. That is, the insulation pattern IP of FIG. 3, the first insulating layer 111 and the second insulating layer 112 of FIG. 4, the stack-type substrate 101 of FIG. 6, the insulation pattern IP of FIG. 8, the insulation pattern IP of FIG. 14, the insulation pattern IP of FIG. 16, or at least one of the structures shown in FIGS. 18 through 22 may be used as the modified example of the display apparatus 5000 of FIG. 24.

Figure 26:
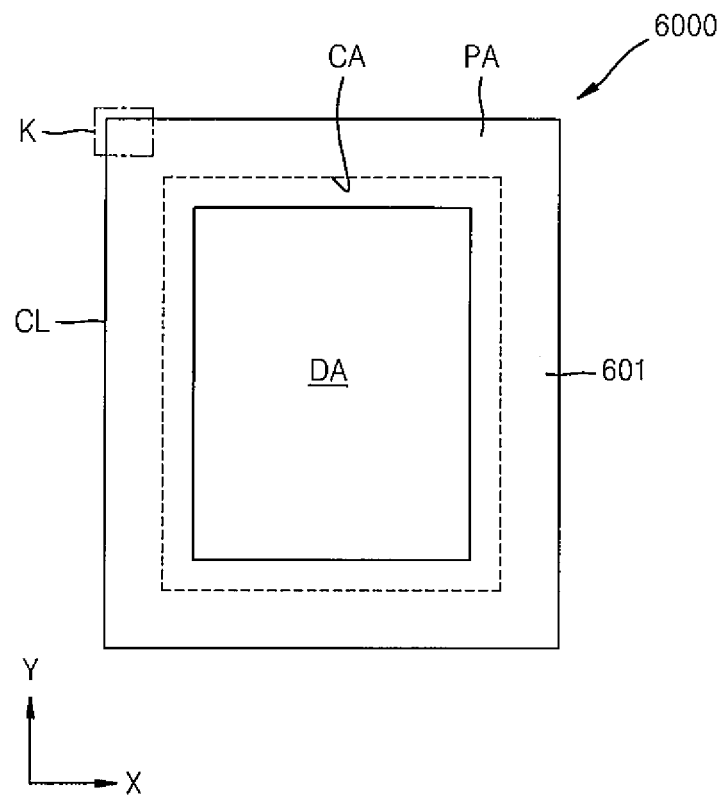
FIG. 26 illustrates a plan view of a display apparatus according to another embodiment of the present invention.
Figure 27:
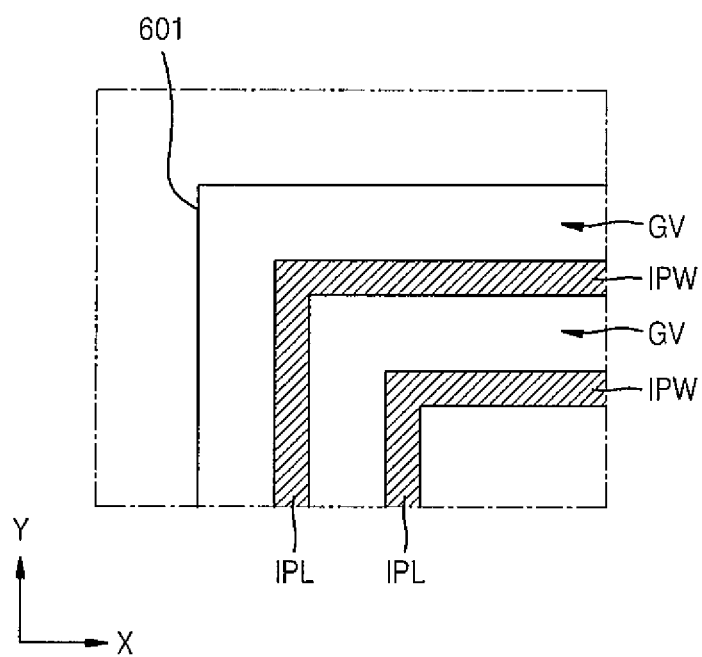
FIG. 27 illustrates a magnified view of a portion K of FIG. 26.

FIG. 26 illustrates a plan view of a display apparatus 6000 according to another embodiment of the present invention. FIG. 27 illustrates a magnified view of a portion K of FIG. 26.

FIGS. 26 and 27 illustrate a corner area of the display apparatus 6000. The structure shown in FIGS. 26 and 27 may be applied to all of the display apparatuses 1000, 2000, 3000, 4000, and 5000, and the modified examples thereof.

The display apparatus 6000 may include a substrate 601. Detailed examples of various suitable materials of the substrate 601 are the same or substantially the same as those described in the previous embodiments, and thus detailed descriptions thereof are omitted here.

A plurality of the display apparatuses 6000 may be formed on a mother substrate, and may be separated into each display apparatus 6000 in a manner that the mother substrate is cut along cutting lines CL of the substrates 601. FIG. 26 illustrates one display apparatus 6000 that is cut along the cutting line CL and thus is separated. Thus, an edge of the substrate 601 is defined by the cutting line CL.

All edges of the substrate 601, i.e., four edges of the substrate 601 shown in FIG. 26, may be cutting lines CL. In an embodiment, one, two, or three of the four edges of the substrate 601 may be cutting lines CL.

That is, according to a size and/or shape of the mother substrate and/or a number, shapes and sizes of the substrates to be produced therefrom, a position or the number of edges from among all edges of the display apparatus 6000 that are determined as a cutting line CL may vary.

The substrate 601 is partitioned into a peripheral area PA and a central area CA. In more detail, the peripheral area PA refers to an area around the cutting line CL, and the central area CA refers to an area that is inwardly positioned, compared to the peripheral area PA.

However, the present embodiment is not limited thereto. That is, the cutting line CL may not exist. In more detail, one display apparatus 6000 may be formed on a mother substrate, and in this case, the substrate 601 may correspond to the mother substrate, so that the cutting line CL may not exist. In this case, the peripheral area PA may refer to an area adjacent to an edge of the substrate 601, and the central area CA may refer to an area that is inwardly positioned, compared to the peripheral area PA. For convenience of description, it is assumed that the cutting line CL exists in embodiments to be described below.

The central area CA may include at least one display area DA.

The display area DA may have at least one display device (not shown), e.g., an OLED for displaying an image. Also, a plurality of pixels may be arranged in the display area DA.

A non-display area (not specified in FIG. 26) may be formed around the display area DA. In more detail, the non-display area may be formed to surround the display area DA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not specified in FIG. 26) may be formed in the non-display area. In this regard, a driver or a plurality of pad units (not specified in FIG. 26) may be disposed in the pad area.

An insulation pattern IP is formed in the peripheral area PA. A groove GV from which a material for forming the insulation pattern IP is removed is formed adjacent to the insulation pattern IP.

The insulation pattern IP includes first direction insulation patterns IPL that extend along a first direction, and second direction insulation patterns IPW that extend along a second direction that crosses the first direction. Each first direction insulation pattern IPL is connected to each second direction insulation pattern IPW.

In an embodiment, each first direction insulation pattern IPL and each second direction insulation pattern IPW may be formed to surround the display area DA.

That is, the first direction insulation patterns IPL may be connected to the second direction insulation patterns IPW, respectively.

In an embodiment, each first direction insulation pattern IPL and each second direction insulation pattern IPW may have a lengthwise extended shape and may be connected to each other at their ends. By doing so, the first direction insulation patterns IPL and the second direction insulation patterns IPW may have a polygonal shape, e.g., a quadrangular shape.

In an embodiment, the first direction and the second direction may be perpendicular to each other. In an embodiment, the first direction or the second direction may be parallel to the edge of the substrate 601.

Although not illustrated, a first insulating layer (not specified in FIG. 26) is disposed between the substrate 601 and the insulation pattern IP and the groove GV. That is, in the peripheral area PA, the first insulating layer is formed on the substrate 601, and the insulation pattern IP and the groove GV are formed on the first insulating layer.

FIGS. 28 through 32 illustrate modified examples of the portion K of FIG. 27.

Figure 28:
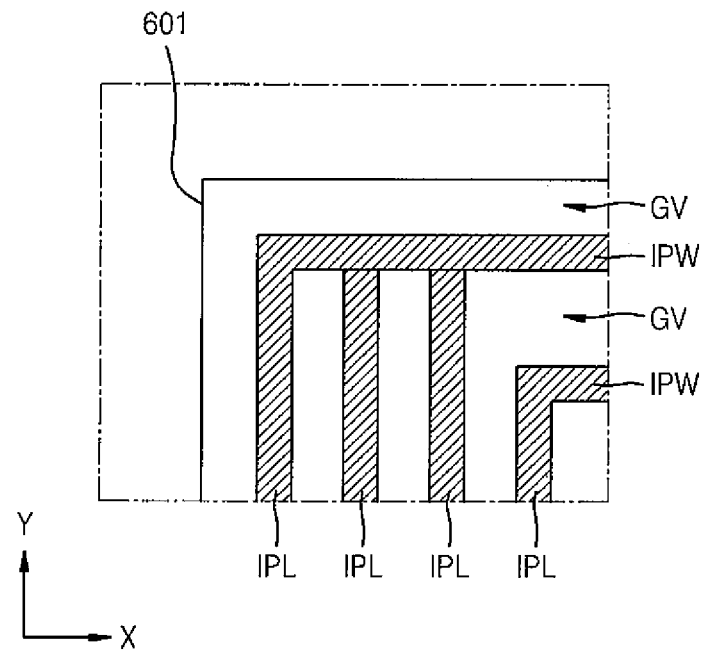
FIGS. 28, 29, 30, 31, and 32 illustrate modified examples of the portion K of FIG. 27.

Referring to FIG. 28, an insulation pattern IP includes first direction insulation patterns IPL that extend along a first direction, and second direction insulation patterns IPW that extend along a second direction that crosses the first direction. The first direction insulation patterns IPL are connected to the second direction insulation patterns IPW.

Here, at least two first direction insulation patterns IPL may be connected to one second direction insulation pattern IPW.

In an embodiment, a plurality of the first direction insulation patterns IPL may be connected to the second direction insulation pattern IPW from among the second direction insulation patterns IPW which is most adjacent to (e.g., nearest to) the edge of the substrate 601.

That is, FIG. 27 may illustrate the example in which the number of the first direction insulation patterns IPL is equal to the number of the second direction insulation patterns IPW, and FIG. 28 may illustrate the example in which the number of the first direction insulation patterns IPL is greater than the number of the second direction insulation patterns IPW.

Figure 29:
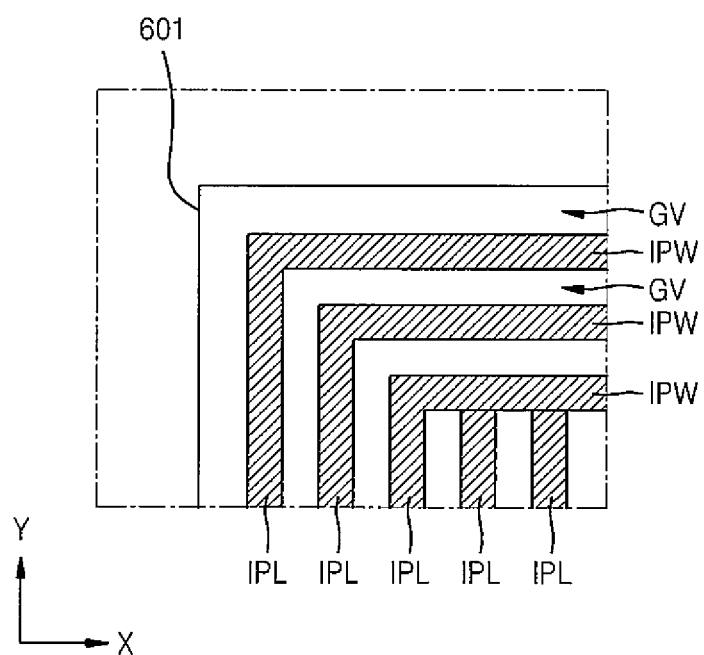

Also, as illustrated in FIG. 29, a plurality of first direction insulation patterns IPL may be connected to a second direction insulation pattern IPW from among second direction insulation patterns IPW, except for other second direction insulation patterns IPW from among the second direction insulation patterns IPW which are adjacent to (e.g., nearer to or nearest to) an edge of the substrate 601. In an embodiment, the plurality of first direction insulation patterns IPL may be connected to a second direction insulation pattern IPW from among the second direction insulation patterns IPW which is most adjacent to (e.g., nearest to) a display area DA.

Although not illustrated, in an embodiment, a plurality of second direction insulation patterns IPW may be connected to one first direction insulation pattern IPL.

In the embodiment, the plurality of second direction insulation patterns IPW may be connected to a first direction insulation pattern IPL from among first direction insulation patterns IPL which is most adjacent to (e.g., nearest to) the edge of the substrate 601.

Figure 30:
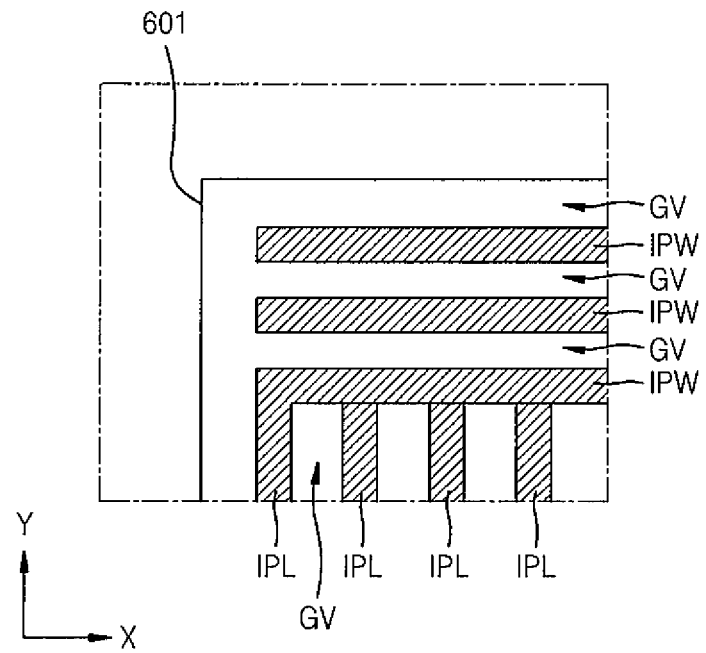

As another embodiment, referring to FIG. 30, an insulation pattern IP includes first direction insulation patterns IPL that extend along a first direction, and second direction insulation patterns IPW that extend along a second direction that crosses the first direction. The first direction insulation patterns IPL are connected to the second direction insulation patterns IPW.

Here, all of the first direction insulation patterns IPL may be connected to one second direction insulation pattern IPW. In an embodiment, all of the first direction insulation patterns IPL may be connected to a second direction insulation pattern IPW that is most adjacent to (e.g., nearest to) a display area DA. By doing so, all of the second direction insulation patterns IPW, except for the second direction insulation pattern IPW, may be separate (e.g., spaced) from the first direction insulation patterns IPL.

Figure 31:
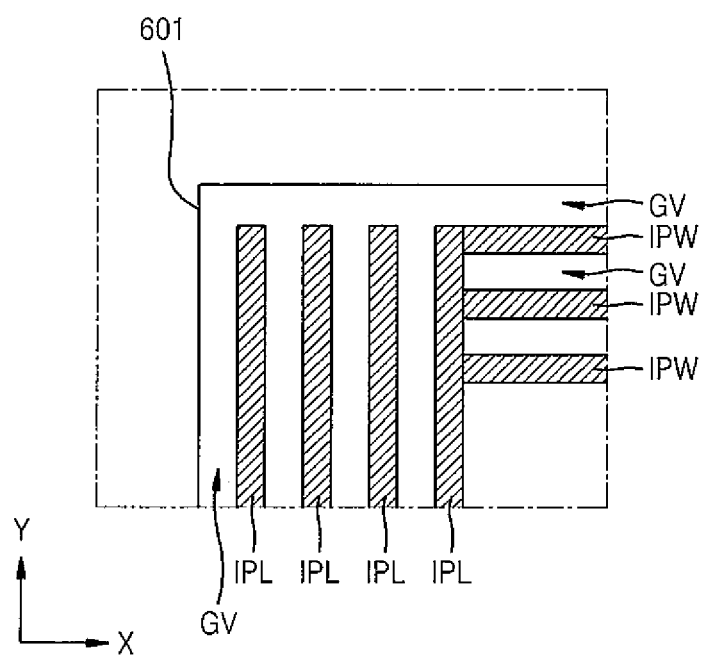

Also, as illustrated in FIG. 31, all of second direction insulation patterns IPW may be connected to one first direction insulation pattern IPL. In an embodiment, all of the second direction insulation patterns IPW may be connected to a first direction insulation pattern IPL that is most adjacent to (e.g., nearest to) a display area DA. By doing so, all of first direction insulation patterns IPL, except for the first direction insulation pattern IPL, may be separated (e.g., spaced) from the second direction insulation patterns IPW.

Figure 32:
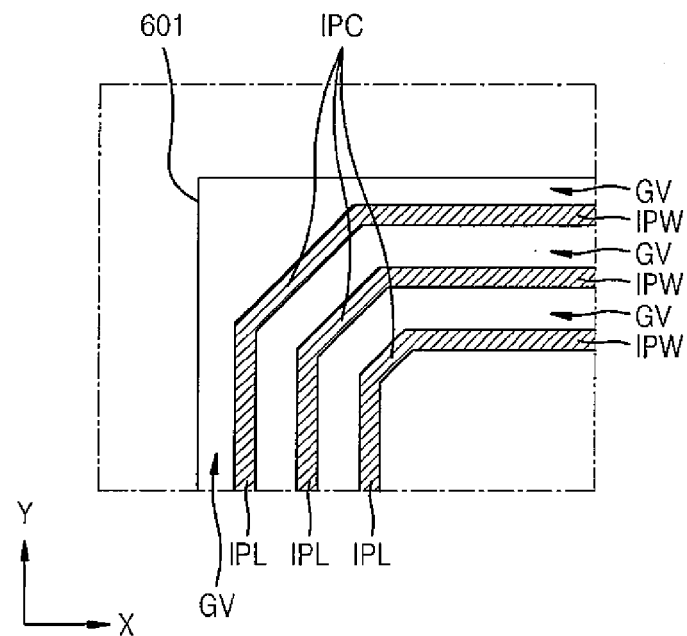

Referring to FIG. 32, an insulation pattern IP includes first direction insulation patterns IPL that extend along a first direction, second direction insulation patterns IPW that extend along a second direction that crosses the first direction, and connection insulation patterns IPC. The connection insulation patterns IPC connect the first direction insulation patterns IPL and the second direction insulation patterns IPW.

In an embodiment, the connection insulation patterns IPC are not parallel to the first direction and the second direction. A part at which each first direction insulation pattern IPL and each second direction insulation pattern are connected to each other has an obtuse angle. By doing so, it is possible to prevent or reduce a damage of the part of the insulation pattern IP at which each first direction insulation pattern IPL and each second direction insulation pattern are connected to each other.

Figure 33:
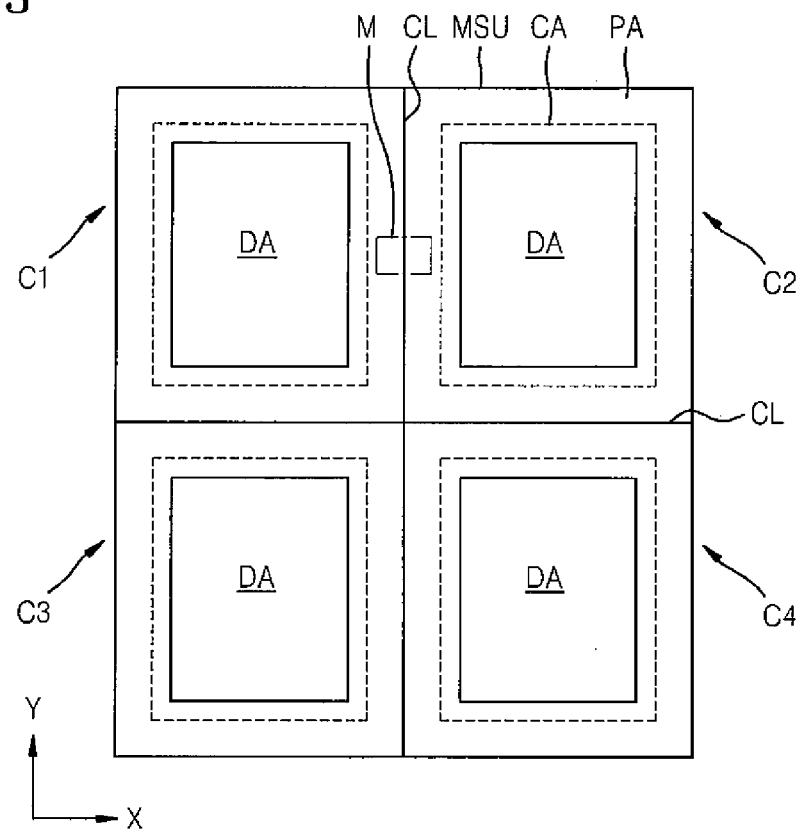
FIG. 33 illustrates a plan view of a mother substrate used in manufacturing a display apparatus, according to an embodiment of the present invention.
Figure 34:
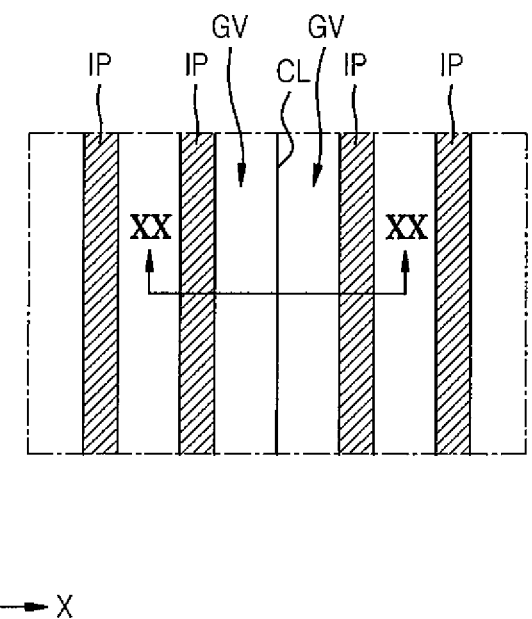
FIG. 34 illustrates a magnified plan view of the portion M of FIG. 33.

FIG. 33 illustrates a plan view of a mother substrate MSU used in manufacturing a display apparatus, according to an embodiment of the present invention. FIG. 34 illustrates a magnified plan view of the portion M of FIG. 33, and FIG. 35 illustrates a cross-sectional view of the portion M, taken along the line XX-XX of FIG. 34.

Figure 35:
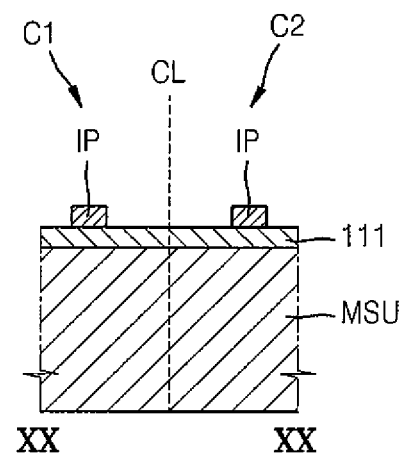
FIG. 35 illustrates a cross-sectional view of the portion M, taken along the line XX-XX of FIG. 34.

Referring to FIGS. 33 through 35, a plurality of cells C1, C2, C3, and C4 are disposed on the mother substrate MSU. The plurality of cells C1, C2, C3, and C4 correspond to a plurality of display apparatuses, respectively.

That is, the mother substrate MSU is cut along cutting fines CL and thus the plurality of cells C1, C2, C3, and C4 are separated. Afterward, four display apparatuses are manufactured via subsequent processes.

The mother substrate MSU may include one or more of various suitable materials known to those skilled in the art. Detailed examples of the various suitable materials of the mother substrate MSU are the same or substantially the same as those described in the previous embodiments, and thus detailed descriptions thereof are omitted here.

Each of the plurality of cells C1, C2, C3, and C4 of the mother substrate MSU is partitioned into a peripheral area PA and a central area CA. In more detail, the peripheral area PA refers to an area around the cutting line CL, and the central area CA refers to an area that is inwardly positioned, compared to the peripheral area PA.

The central area CA may include at least one display area DA.

The display area DA may have at least one display device (not specified in FIG. 33), e.g., an OLED for displaying an image. Also, a plurality of pixels may be arranged in the display area DA.

A non-display area (not specified in FIG. 33) may be formed around the display area DA. In more detail, the non-display area may be formed to surround the display area IDA. In an embodiment, the non-display area may be formed to be adjacent to a plurality of sides of the display area DA. In another embodiment, the non-display area may be formed to be adjacent to one side of the display area DA.

In another embodiment, only the display area DA may be arranged in the central area CA. That is, the non-display area may be formed only in the peripheral area PA.

A pad area (not specified in FIG. 33) may be formed in the non-display area. In this regard, a driver or a plurality of pad units (not specified in FIG. 33) may be disposed in the pad area.

The peripheral area PA refers to the area around the cutting line CL, and is arranged in side ends of the mother substrate MSU, along the cutting line CL.

An insulation pattern IP is formed in the peripheral area PA. A groove GV from which a material for forming the insulation pattern IP is removed is formed adjacent to the insulation pattern IP.

A first insulating layer 111 is disposed between the mother substrate MSU and the insulation pattern IP and the groove GV. That is, in the peripheral area PA, the first insulating layer 111 is formed on the mother substrate MSU, and the insulation pattern IP and the groove GV are formed on the first insulating layer 111.

Referring to FIG. 35, an area of the mother substrate MSU that corresponds to the cutting line CL corresponds to the groove GV of the cells C1 and C2, and the insulation patterns IP are disposed with the cutting line CL interposed therebetween. That is, the insulation pattern IP of the cell C1 and the insulation pattern IP of the cell C2 are disposed on opposite sides of the cutting line CL.

In the present embodiment, in order to manufacture the display apparatus, the mother substrate MSU may be cut along the cutting lines CL. Here, the cutting lines CL correspond to the grooves GV. The grooves GV block or substantially prevent a crack of the mother substrate MSU that may occur during a cutting process, and prevent or reduce propagation of the crack.

In particular, the grooves GV correspond to a top surface of the first insulating layer 111 on the mother substrate MSU. Since the first insulating layer 111 is formed in the grooves GV that are adjacent to the insulation patterns IP, the mother substrate MSU may be efficiently protected, and the occurrence and propagation of the crack may be prevented or reduced.

Also, due to the first insulating layer 111, it is possible to prevent or substantially prevent the insulation patterns IP from being delaminated from the mother substrate MSU.

The insulation patterns IP are adjacent to the grooves GV that are adjacent to the cutting lines CL of the mother substrate MSU and thus secondly prevent or reduce the propagation of the crack. Also, the insulation patterns IP improve or may improve durability of the peripheral area PA. In particular, when the mother substrate MSU is formed of a flexible material and thus the display apparatus has flexibility, the insulation patterns IP may efficiently protect the peripheral area PA while a curving or bending motion occurs at the peripheral area PA.

According to the one or more of the above embodiments of the present invention, the display apparatus may have improved durability It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A display apparatus comprising a substrate comprising a central area and a peripheral area adjacent to the central area, the central area comprising a display area, the display apparatus further comprising:
   a first insulating layer on the substrate;
   a plurality of insulation patterns on the first insulating layer at the peripheral area and extending along a same plane that is substantially parallel to the substrate;
   a groove located between respective ones of the insulation patterns; and
   a thin-film transistor (TFT) at the central area of the substrate, the TFT comprising an active layer, the active layer being directly on the first insulating layer,
   wherein at least a portion of the plurality of insulation patterns is substantially parallel to one edge of the substrate in a plan view.

2. The display apparatus of claim 1, wherein the groove comprises a plurality of grooves, and
   one of the grooves is adjacent to at least one edge of the substrate.

3. The display apparatus of claim 2, wherein the one of the grooves is adjacent to all edges of the substrate.

4. The display apparatus of claim 1, wherein the insulation patterns are spaced from at least one edge of the substrate.

5. The display apparatus of claim 1, wherein the first insulating layer is a single layer.

6. The display apparatus of claim 1, wherein the first insulating layer comprises a plurality of stacked layers.

7. The display apparatus of claim 1, wherein the first insulating layer comprises an inorganic material.

8. The display apparatus of claim 1, wherein the first insulating layer comprises oxide, nitride, or oxynitride.

9. The display apparatus of claim 1, wherein the first insulating layer extends over at least a portion of the central area on the substrate.

10. The display apparatus of claim 1, wherein the first insulating layer extends over at least a portion of the display area on the substrate.

11. The display apparatus of claim 1, wherein the first insulating layer completely covers a top surface of the substrate.

12. The display apparatus of claim 1, wherein the first insulating layer exposes a portion of a top surface of the substrate.

13. The display apparatus of claim 1, wherein the insulation patterns extend lengthwise in parallel to at least one edge of the substrate.

14. The display apparatus of claim 1,
   wherein the plurality of the insulation patterns that are spaced from each other are formed in one direction,
   the groove comprises a plurality of grooves, and
   the grooves are located between the insulation patterns that are adjacent to each other.

15. The display apparatus of claim 14, further comprising another plurality of insulation patterns formed in another direction that crosses the one direction.

16. The display apparatus of claim 1, wherein at least one edge of the substrate is defined by a cutting line.

17. The display apparatus of claim 1, wherein the insulation patterns comprise multiple layers.

18. The display apparatus of claim 1, wherein the insulation patterns comprise an inorganic material.

19. The display apparatus of claim 1, wherein the insulation patterns comprise a central insulation pattern and a peripheral insulation pattern around the central insulation pattern, and
   a width of the central insulation pattern is different from a width of the peripheral insulation pattern.

20. The display apparatus of claim 19, wherein the width of the central insulation pattern is greater than the width of the peripheral insulation pattern.

21. The display apparatus of claim 1, wherein ones of the insulation patterns have an island pattern.

22. The display apparatus of claim 1, wherein ones of the insulation patterns have a curved edge.

23. The display apparatus of claim 1, wherein ones of the insulation patterns have a circular-arc edge, a round edge, or an oval edge.

24. The display apparatus of claim 1, further comprising a central insulating layer at the central area on the substrate.

25. The display apparatus of claim 24, wherein the insulation patterns and the central insulating layer comprise the same or substantially the same material.

26. The display apparatus of claim 24, wherein a portion of the central insulating layer extends over a portion of the peripheral area.

27. The display apparatus of claim 24, wherein the groove is located between the central insulating layer and one of the insulation patterns nearest to the central area.

28. The display apparatus of claim 1, wherein the substrate comprises an organic material.

29. The display apparatus of claim 1, wherein the substrate comprises multiple layers.

30. The display apparatus of claim 29, wherein the substrate comprises a first layer comprising an organic material, a second layer comprising an organic material, and an insertion layer between the first layer and the second layer.

31. The display apparatus of claim 1, further comprising at least one conductive pattern in the groove and contacting a top surface or a side surface of at least one of the insulation patterns.

32. The display apparatus of claim 31, wherein the at least one conductive pattern comprises a pad unit.

33. The display apparatus of claim 1, further comprising a cover layer on the insulation patterns.

34. The display apparatus of claim 33, wherein the cover layer comprises an organic material.

35. The display apparatus of claim 1, wherein the insulation patterns comprise a first direction insulation pattern extending along a first direction and a second direction insulation pattern extending along a second direction that crosses the first direction.

36. The display apparatus of claim 35, wherein the first direction insulation pattern is connected to the second direction insulation pattern.

37. The display apparatus of claim 35, wherein the first direction insulation pattern and the second direction insulation pattern surround the display area.

38. The display apparatus of claim 35, wherein the first direction insulation pattern and the second direction insulation pattern are connected to each other in a one-to-one manner and surround the display area.

39. The display apparatus of claim 35, wherein the first direction insulation pattern and the second direction insulation pattern are connected to each other at their ends.

40. The display apparatus of claim 35, wherein the first direction insulation pattern comprises a plurality of first direction insulation patterns and the second direction insulation pattern comprises a plurality of second direction insulation patterns, and
two or more first direction insulation patterns from among the plurality of first direction insulation patterns are connected to one second direction insulation pattern from among the plurality of second direction insulation patterns.

41. The display apparatus of claim 40, wherein the one second direction insulation pattern that is connected to the two or more first direction insulation patterns is nearest to an edge of the substrate.

42. The display apparatus of claim 40, wherein the one second direction insulation pattern that is connected to the two or more first direction insulation patterns is closer to the display area, compared to another second direction insulation pattern that is nearest to an edge of the substrate from among the second direction insulation patterns.

43. The display apparatus of claim 40, wherein one or more first direction insulation patterns from among the plurality of first direction insulation patterns are not connected to the plurality of the second direction insulation patterns.

44. The diplay apparatus of claim 35, wherein the first direction insulation pattern comprises a plurality of first direction insulation patterns and the second direction insulation pattern comprises a plurality of second direction insulation patterns, and
two or more second direction insulation patterns from among the plurality of second direction insulation patterns are connected to one first direction insulation pattern from among the plurality of first direction insulation patterns.

45. The display apparatus of claim 44, wherein the one first direction insulation pattern that is connected to the two or more second direction insulation patterns is nearest to an edge of the substrate.

46. The display apparatus of claim 44, wherein the one first direction insulation pattern that is connected to the two or more second direction insulation patterns is closer to the display area, compared to another first direction insulation pattern that is nearest to an edge of the substrate from among the first direction insulation patterns.

47. The display apparatus of claim 44, wherein one or more second direction insulation patterns from among the plurality of the second direction insulation patterns are not connected to the plurality of the first direction insulation patterns.

48. The display apparatus of claim 35, wherein the insulation patterns further comprise a connection insulation pattern that connects the first direction insulation pattern and the second direction insulation pattern.

49. The display apparatus of claim 48, wherein the connection insulation pattern is not parallel to the first direction and the second direction.

50. The display apparatus of claim 1, wherein the TFT further comprises a gate electrode, a source electrode, and a drain electrode,
wherein at least one adjacent insulating layer is adjacent to at least one of the active layer, the gate electrode, the source electrode, and the drain electrode, and
wherein the insulation patterns and the at least one adjacent insulating layer comprise the same or substantially the same material.

51. The display apparatus of claim 50, wherein the first insulating layer is between the substrate and the TFT.

52. The display apparatus of claim 50, wherein the at least one adjacent insulating layer is at least one of a gate insulating layer for insulating the gate electrode from the active layer, and an interlayer insulating layer for insulating the source and drain electrodes from the gate electrode.

53. The display apparatus of claim 50, further comprising a passivation layer for covering the TFT,
wherein the passivation layer is on at least one of the insulation patterns.

54. The display apparatus of claim 50, further comprising a first electrode that is connected to the at least one TFT and a pixel defining layer that covers a portion of the first electrode and defines a pixel area,
wherein the pixel defining layer is on at least one of the insulation patterns.

55. The display apparatus of claim 54, further comprising:
a second electrode that faces the first electrode; and
an intermediate layer between the first electrode and the second electrode, the intermediate layer comprising an organic emission layer.

56. A method of manufacturing a display apparatus comprising a substrate comprising a central area and a peripheral area adjacent to the central area, the central area comprising a display area, the method comprising:
forming a first insulating layer on the substrate;

forming a plurality of insulation patterns on the first insulating layer at the peripheral area and extending along a same plane that is substantially parallel to the substrate;

forming a groove between respective ones of the insulation patterns; and forming a thin-film transistor (TFT) at the central area of the substrate, the TFT comprising an active layer directly on the first insulating layer, wherein at least a portion of the plurality of insulation patterns is substantially parallel to one edge of the substrate in a plan view.

57. The method of claim 56, further comprising forming a central insulating layer at the central area of the substrate, and wherein at least one of the insulation patterns and the central insulating layer comprise the same or substantially the same material.

58. The method of claim 57, wherein the insulation patterns and the central insulating layer are concurrently formed.

59. The method of claim 56, wherein the first insulating layer is at the peripheral area and the central area.

60. A method of manufacturing a display apparatus by using a mother substrate, the method comprising:

cutting the mother substrate along a cutting line, wherein the display apparatus comprises a central area and a peripheral area adjacent to the central area, the central area comprising a display area; a first insulating layer on the mother substrate; a plurality of insulation patterns on the first insulating layer at the peripheral area and extending along a same plane that is substantially parallel to the substrate; a groove located between respective ones of the insulation patterns; and a thin-film transistor (TFT) at the central area of the mother substrate, the TFT comprising an active layer, the active layer being directly on the first insulating layer, wherein at least a portion of the plurality of insulation patterns is substantially parallel to one edge of the cut substrate in a plan view, and wherein the cutting line corresponds to the groove and is separated from the insulation patterns.

* * * * *